United States Patent
Moslehi

(10) Patent No.: US 11,901,738 B2
(45) Date of Patent: Feb. 13, 2024

(54) DISTRIBUTED MULTI-MODAL POWER MAXIMIZING INTEGRATED CIRCUIT FOR SOLAR PHOTOVOLTAIC MODULES

(71) Applicant: Sigmagen, Inc., Los Altos, CA (US)

(72) Inventor: Mehrdad M. Moslehi, Los Altos, CA (US)

(73) Assignee: Sigmagen, Inc., Los Altos, CA (US)

( * ) Notice: Subject to any disclaimer, the term of this patent is extended or adjusted under 35 U.S.C. 154(b) by 376 days.

(21) Appl. No.: 16/617,216

(22) PCT Filed: Apr. 30, 2018

(86) PCT No.: PCT/US2018/030271
§ 371 (c)(1),
(2) Date: Nov. 26, 2019

(87) PCT Pub. No.: WO2018/222320
PCT Pub. Date: Dec. 6, 2018

(65) Prior Publication Data
US 2021/0126580 A1  Apr. 29, 2021

Related U.S. Application Data

(60) Provisional application No. 62/512,575, filed on May 30, 2017.

(51) Int. Cl.
*H02J 3/38* (2006.01)
*H02S 40/30* (2014.01)
*H02S 50/10* (2014.01)
*H01L 31/05* (2014.01)
*H02J 3/46* (2006.01)

(52) U.S. Cl.
CPC .......... *H02J 3/381* (2013.01); *H01L 31/0504* (2013.01); *H02J 3/46* (2013.01);
(Continued)

(58) Field of Classification Search
CPC ......... Y02E 10/56; H02J 2300/26; H02J 3/46; H02S 40/30; H02S 50/10; H01L 31/0504
See application file for complete search history.

(56) References Cited

U.S. PATENT DOCUMENTS

2008/0150366 A1* 6/2008 Adest .................. H02M 3/1582
307/77
2010/0327659 A1* 12/2010 Lisi ........................... G05F 1/67
307/82
(Continued)

FOREIGN PATENT DOCUMENTS

WO   2005/027300 A1   3/2005
WO   2017/087988 A1   5/2017

OTHER PUBLICATIONS

Carvalho, et al., Electronics Letters, 2013, vol. 49, No. 10 (Year: 2013).*
(Continued)

*Primary Examiner* — Sadie White
(74) *Attorney, Agent, or Firm* — Pillsbury Winthrop Shaw Pittman LLP

(57) ABSTRACT

Disclosed herein is add-on electronic circuit structures and methods for providing protection against reverse-electrical-current failures and for enabling comprehensive electrical (current-voltage sweep) and electro-optical (electroluminescence or EL using reserve current flow) testing of solar photovoltaic cells and modules having at least one multi-modal maximum-power-point tracking (MPPT) power optimizer integrated circuit chip to increase electrical energy generation yield of the modules. Such multi-modal MPPT power optimizer chips are used for distributed solar electric power generation enhancement in solar photovoltaic cells, modules, and systems under realistic manufacturing and environmental variations
(Continued)

(e.g., variable and/or non-uniform sunlight or daylight, mismatched cells, etc.).

19 Claims, 42 Drawing Sheets

(52) U.S. Cl.
CPC .............. *H02S 40/30* (2014.12); *H02S 50/10* (2014.12); *H02J 2300/26* (2020.01)

(56) References Cited

U.S. PATENT DOCUMENTS

| | | | | |
|---|---|---|---|---|
| 2011/0057617 A1* | 3/2011 | Finberg | ................ | H02J 7/0021 |
| | | | | 320/122 |
| 2012/0043818 A1* | 2/2012 | Stratakos | ............. | H03K 17/145 |
| | | | | 307/77 |
| 2012/0319489 A1* | 12/2012 | McCaslin | ................ | H02H 7/20 |
| | | | | 307/77 |
| 2013/0106194 A1* | 5/2013 | Jergovic | ................... | H02J 3/46 |
| | | | | 307/77 |
| 2013/0181530 A1* | 7/2013 | Deboy | ...................... | H02J 3/40 |
| | | | | 307/82 |
| 2014/0103723 A1* | 4/2014 | Jergovic | ................. | H02J 3/381 |
| | | | | 307/43 |
| 2017/0133983 A1 | 5/2017 | Moslehi et al. | | |

OTHER PUBLICATIONS

Patent Cooperation Treaty, International Search Report for PCT/US2018/030271, dated Jul. 31, 2018. pp. 1-2.

* cited by examiner

TABLE 1

| | MIN | MAX | |
|---|---|---|---|
| FET P CHANNEL | | | |
| Rd on | | 20 | milli-ohms |
| Gate Threshold | | -2 | Volts |
| Comparator | | | |
| Trip | 0.2A | 0.4 | Amp |
| Hysteresis | 0.4 | 0.6 | Amp |
| Power-On-Reset (POR) | | | |
| Time out | 400 | 1000 | ms |
| Trip point | 1.5 | 2 | Volts |

FIG. 13A

TABLE 2

| REF DES | VALUE | MAIN P/N | Manufacturer |
|---|---|---|---|
| R1 | 200 | ERJ-3EKF2000V | Panasonic |
| R2 | 1.0M | ERJ-3EKF1004V | Panasonic |
| R3 | 20 | ERJ-3EKF20R0V | Panasonic |
| R4 | 40.2K | ERJ-3EKF4022V | Panasonic |
| R5 | 750K | ERJ-3GEYJ754V | Panasonic |
| R6 | 249K | ERJ-3EKF2493V | Panasonic |
| R7 | 5.1K | ERJ-3GEYJ512V | Panasonic |
| R8 | 5.1K | ERJ-3GEYJ512V | Panasonic |
| R9 | 0 OHMs | | |
| C1 | 0.1nF | 0603G104ZAT2A | AVX |
| C2 | 0.1nF | 0603G104ZAT2A | AVX |
| Q1 | P-FET | DMP201MFK-7 | DIODES |
| Q2, Q3 | Dual | DMC2400UV-7 | DIODES |
| U1 | Comparator | LTI716CS5 | Linear Technology |
| U2 | POR | MAX16052ALT+T | MAXIM Integrated |
| U3 | MPPT IC | Multi-Modal MPPT IC | Signagen-Diodes |

FIG. 13B

TABLE 3

| | First Set of Tests | | Second Set of Tests | | | |
|---|---|---|---|---|---|---|
| | Half A - Old PCBs | Half B - New PCBs | Half A - New PCBs | Half B - New PCBs | Half A - Old Vs New | Half B - New Vs retest |
| Module Temp: | 20.7149 | 20.7252 | 19.8193 | 19.734 | -4% | -5% |
| Corrected To: | 20.7149 | 20.7252 | 19.8193 | 19.734 | -4% | -5% |
| Voc: | 37.9451 | 45.0274 | 45.7728 | 45.2297 | 21% | 0% |
| Isc: | 1.75069 | 4.44815 | 4.49341 | 4.53007 | 157% | 2% |
| Pmax: | 124.36 | 135.804 | 140.016 | 139.368 | 13% | 3% |
| Vpm: | 31.0483 | 38.1256 | 38.7683 | 38.1858 | 25% | 0% |
| Ipm: | 4.00538 | 3.56201 | 3.61162 | 3.65498 | -10% | 3% |
| Fill Factor: | 1.87204 | 0.67804 | 0.68076 | 0.68117 | -64% | 0% |

FIG. 17

TABLE 4

| POR TIMING | | | |
|---|---|---|---|
| | mS | | |
| 1 | 742 | | |
| 2 | 652 | | |
| 3 | 714 | | |
| 4 | 656 | | |
| 5 | 616 | MAX | 742 |
| 6 | 630 | MIN | 616 |
| 7 | 650 | AVE | 674.5 |
| 8 | 678 | | |
| 9 | 718 | Median | 671 |
| 10 | 646 | | |
| 11 | 680 | | |
| 12 | 698 | | |
| 13 | 694 | | |
| 14 | 704 | | |
| 15 | 650 | | |
| 16 | 664 | | |

TABLE 5

Package: U-QFN3055-28

| Pin Number | Pin Name | Function |
|---|---|---|
| 1-4 | $V_M$ | $V_M$ Power pin – connects to Solar PV cell negative voltage |
| 5-12 | $V_{SW}$ | Power Switching Output |
| 13 | NC | No Connect |
| 14 | BS | High side gate drive boost input |
| 15 | TADCEAI | Test ADC and Error Amplifier Input. Used to Evaluate and Test the MPPT IC only. Not connected in Solar PV Application |
| 16 | EN | Enable pin. Used to Evaluate and Test the MPPT IC only. Not connected in Solar PV Application. |
| 17 | $AV_M$ | Analog $V_M$ Connection. Connected to $V_M$ Power pin and Solar PV cell negative voltage |
| 18 | $DV_M$ | Digital $V_M$ Connection. Connected to $V_M$ Power pin and Solar PV cell negative voltage |
| 19 | TADCO | Test ADC Output. Used to Evaluate and Test the MPPT IC only. Not connected in Solar PV Application |
| 20 | $AV_P$ | Analog $V_P$ Connection. Connected $V_P$ Power supply and to the Solar PV cell positive voltage |
| 21-28 | $V_P$ | $V_P$ Power supply - Connect to Solar PV cell positive voltage |
| Pad | Pad | The center exposed pad – connected to $V_M$ Power pin and to Solar PV cell negative voltage |

FIG. 32

TABLE 6A

Absolute Maximum Ratings (@T$_A$ = +25°C, unless otherwise specified.)

| Symbol | Parameter | Rating | Unit |
|---|---|---|---|
| V$_P$ – V$_M$ | Device VP – VM differential voltage (Note 7) | -0.3 to 11 | V |
| I$_{OUT}$ | Output current (source and sink) | 3.5 | A |
| P$_D$ | Package Power Dissipation U-QFN3055-28 | (TBD) | mW |
| θ$_{JC}$ | Thermal Resistance (Junction to Case) | TBD | °C/W |
| θ$_{JA}$ | Thermal Resistance (Junction to Ambient) | TBD | °C/W |
| T$_S$ | Storage Temperature Range | -65 to +150 | °C |
| T$_{J,MAX}$ | Maximum Junction Temperature | 150 | °C |
| | Soldering temperature | 300 (5s) | °C |

FIG. 34A

TABLE 6B

Recommended Operating Conditions (@T$_A$ = +25°C, unless otherwise specified.)

| Symbol | Parameter | Conditions | Rating | Unit |
|---|---|---|---|---|
| V$_P$ | Supply Voltage V$_P$ – V$_M$ | Pass-Through & optimizing (Switching) Mode | 5.0V to 10.5V (Rising) / 4.75V to 10.5V (Falling) | V |
| | Supply Voltage V$_P$ – V$_M$ | Active Bypass Mode | 4.5V to 5.0V (Rising) / 4.75V to 4.25V (Falling) | V |
| T$_A$ | Operating Temperature Range | Operating | -40 to +105 | °C |
| T$_J$ | Junction Temperature Range | Operating | -40 to +125 | °C |

FIG. 34B

TABLE 7

Electrical Characteristics (@T$_A$ = +25°C, C$_{in}$ = 5µF, unless otherwise specified.)

| Symbol | Parameter | Conditions | Min | Typ | Max | Unit |
|---|---|---|---|---|---|---|
| Supply Current | | | | | | |
| V$_P$ | Solar Cell Input Voltage Range with Respect to V$_M$ | Voc from 4.5V to 10.5V | 4.5 | 7.21 | 10.5 | V |
| | Optimization Mode to Active By Pass Mode Transition Threshold | Vp–Vm Falling | | 4.75 | | |
| | Active Bypass Mode to Optimization Mode Transition Threshold | Vp–Vm Rising | | 5 | | |
| V$_{UVLO}$ | Under voltage lockout (UVLO) threshold | V$_P$ rising | 4.0 | 4.25 | 4.5 | V |
| | | Hysteresis | | 199 | | mV |
| | Regulated Input Voltage accuracy, in Optimization Mode | Vp–Vm from 5V to 10.5V | –3.0 | | +3.0 | % |
| | Vmpp Target Ratio Range (Actual final ratio set to be 0.76) | Vmpp / Voc | | 0.76 | | |
| | Load Current | Panel of solar cell looks like a constant current Over Temperature | | 2.24 | 2.75 | A |
| I$_L$ | Load Current Limit | | | 3.5 | | A |
| I$_Q$ | Quiescent current | Pass-Through Mode, Steady-State | | 1400 | 4000 | µA |
| I$_{BP}$ | Active Bypass Mode | VP – VM = (4.65V Rising, Active Bypass) | | 10 | 24 | mA |
| I$_{SD}$ | Shutdown Current | Enable asserted | | 20 | 40 | µA |
| f$_{OSC}$ | Oscillator Frequency | | 350 | 500 | 650 | kHz |
| t$_S$ | Start-Up Time | Can be longer such as 100s of mS | | 1.14 | 2 | ms |
| R$_{DS(ON)H}$ | Drain-Source On-State Resistance High Side NMOS | I$_{DS}$ = 2A, Pass through mode | | 18 | 24 | mΩ |
| R$_{DS(ON)L}$ | Drain-Source On-State Resistance of Low Side NMOS | I$_{DS}$ = 2A, Active Bypass mode | | 36 | 54 | mΩ |
| OTP | Over Temperature Protection | | | 150 | | °C |
| OTH | OTP Hysteresis | | | 30 | | °C |
| η | Efficiency (switching mode) | I$_O$ = 2.25A, VP 6.5 – 8.5 | TBD | 98.4 | | % |
| | Sample Timing Range | Time between Voc samples (Range) | 2 | | 20 | s |
| | Sample Time | Time between Voc samples | | 1 | | s |
| | Sample time | Time to Charge Input Cap to Voc voltage | | 620 | | µS |
| C$_{Boost}$ | Boost Capacitor on Boost pin | | | 4700 | | nF |

FIG. 35

TABLE 6

| Dim | U-QFN3055-28 | | |
|---|---|---|---|
| | Min | Max | Typ |
| A | 0.55 | 0.65 | 0.60 |
| A1 | 0.00 | 0.05 | 0.02 |
| b | 0.15 | 0.25 | 0.20 |
| D | 5.45 | 5.55 | 5.50 |
| D2 | 3.85 | 3.95 | 3.90 |
| E | 2.95 | 3.05 | 3.00 |
| E2 | 1.35 | 1.45 | 1.40 |
| e | 0.45 BSC | | |
| k | 0.400 BSC | | |
| k1 | 0.400 BSC | | |
| L | 0.35 | 0.45 | 0.40 |
| z | 0.625 BSC | | |
| z1 | 0.725 BSC | | |
| All Dimensions in mm | | | |

FIG. 36A Side View

FIG. 36B Bottom View

DISTRIBUTED MULTI-MODAL POWER MAXIMIZING INTEGRATED CIRCUIT FOR SOLAR PHOTOVOLTAIC MODULES

CROSS REFERENCE TO RELATED APPLICATIONS

This application is a U.S. National Phase patent application of PCT/US2018/030271, filed Apr. 30, 2018, which claims priority to U.S. Provisional Patent Application 62/512,575, filed May 30, 2017, both of which are hereby incorporated by reference in their entirety.

TECHNICAL BACKGROUND

The present disclosure relates generally to solar photovoltaic (PV) electricity generation systems, and specifically to add-on electronic circuit structures and methods for providing protection against reverse-electrical-current failures and for enabling comprehensive electrical and electro-optical performance and quality testing for solar photovoltaic cells and modules having distributed photovoltaic power-maximizing electronics.

Solar cells and modules are made of semiconductor photovoltaic electricity-generating devices, typically manufactured on crystalline silicon (multi-crystalline or monocrystalline) wafers, that convert light (e.g., photons from direct sunlight and diffuse daylight) into electrical energy. The photovoltaic solar cells are most commonly made using manufacturing process flows with a plurality of process steps (e.g., some or all of cleaning, deposition, doping, patterning, etching, metallization, etc.) relatively similar to manufacturing semiconductor integrated circuits using crystalline silicon wafers. A solar cell is simply a very large-area (e.g., 125 mm×125 mm or 156.75 mm×156.75 mm or other crystalline silicon wafer dimensions as required and applicable) diode built in a planar semiconductor wafer such as crystalline silicon wafers (or alternatively in a thin semiconductor layer or a thin-film semiconductor such as cadmium telluride: CdTe, perovskites, amorphous silicon, or copper indium gallium selenide: CIGS) with connecting electrical leads to extract the electrical power (combination of photo-generated voltage and current).

A crystalline silicon solar cell, when exposed to light, produces an open-circuit voltage (Voc) of about 0.6V to 0.75 V (the exact value of Voc depending on the solar cell technology, with higher open-circuit voltage or Voc values typically representing more advanced and higher efficiency technologies) and the photo-generation current capability (as measured by the short-circuit current or Isc) is dependent on the area of the solar cell as well as the solar cell technology (including the solar cell semiconductor material). There are essentially infinite voltage and current points associated with the current-voltage (also known as I-V) curve of a solar cell for a given light intensity. There is open-circuit voltage Voc corresponding to zero current (when the solar cell terminals are open and not attached to a finite impedance load), short-circuit current Isc corresponding to zero voltage (when the solar cell terminals are electrically shorted together, allowing maximum electrical current flow), and somewhere in between these two points is what is known as the maximum-power point (MPP) of the solar cell where the electrical power generation of the solar cell is at its maximum value. The graphs in FIG. 1 correspond to an example 60-cell crystalline silicon crystalline silicon solar photovoltaic module (in which all 60 solar cells are connected in electrical series, resulting in a solar module with the same electrical current value as the current of a single solar cell and the module voltage being the sum of cell voltages or about 60 times the voltage value of a single solar cell).

In the representative example of current-voltage (I-V) curve 101 and power-voltage (P-V) curve 102 for a 60-cell crystalline silicon module shown in FIG. 1, the PV module open-circuit voltage (Voc) is approximately 40 V at 0 A current flow, and the PV module short-circuit current (Isc) is approximately 9.5 A at 0 voltage (measured after electrically shorting the module leads). The operating point where the PV module power curve reaches its maximum-power point (i.e., the operating point at about 33 V module voltage and 9 A module current) is known as the maximum-power point or MPP of the solar module. The MPP point depends on various operating and environmental factors and parameters including the solar cell technology, sunlight intensity, and ambient temperature. This is the point where all solar cells connected together in a PV module should ideally operate in order to produce and extract the most electrical power from the solar module at any time during its power generation. One primary problem is the fact that the maximum-power point (MPP) does not stay in one place and depends on the operating and environmental conditions (and may also be different in various solar cells within a module due to variations in solar cell parameters and incident light intensity non-uniformities). MPP is affected by sunlight intensity variations (from sunrise to sunset), ambient temperature, shading and soiling conditions, etc. System-level and PV module-level electronic power optimizers have been developed to constantly adjust the operating conditions (current and voltage) at the PV system level or at the module level in order to operate strings of interconnected PV modules and/or each individual PV module at the Maximum Power Point (MPP) for maximum power generation and enhanced solar energy yield. These inventors have also invented and realized a multi-modal Maximum-Power-Point-Tracking (MPPT) integrated circuit chip which is covered by the PCT utility patent application number PCT/US16/63209 filed on Nov. 21, 2016, entitled: "Multi-Modal Maximum-Power-Point-Tracking Optimization Solar Photovoltaic System", claiming the benefit of U.S. provisional patent application 62/257,698 filed on Nov. 19, 2015. The add-on protection and testability circuit of this disclosure has been successfully integrated, tested and proven to work very well with the multi-modal MPPT chip covered by the above-mentioned PCT utility patent application. The technical specifications for the above-mentioned multi-modal MPPT integrated circuit chip compatible with the add-on reverse current protection and testability circuit of this disclosure are enclosed with this document as reference.

To make up a solar PV module (the crystalline solar PV modules are typically made of 60, 72, 96, or other numbers of solar cells), a plurality of photovoltaic solar cells are typically connected in electrical series to increase the solar cell string voltage. This configuration is used for several reasons but the main reason is to limit the $I^2 \cdot R$ (I and R being the electrical current and resistance, respectively) ohmic losses (compared to parallel connections of solar cells which would increase the overall current and the resulting ohmic power dissipation losses). One potential problem with connecting solar cells in electrical series is the fact that they must preferably all have the same max power point current (to match the current in the series string), otherwise, the MPP current mismatch among various will result in partial loss of photo-generated power produced and delivered by the module. Manufactures strive to make their solar cells identical through strict manufacturing controls (by controlling the manufacturing process flow and tightening the solar cell parametric distributions) so they all would have electrical parameters within tight distributions (and with similar MPP currents and voltages). But due to various conditions and variation sources out of their control, the maximum power point (MPP) current (and voltage) can vary from cell to cell. Besides manufacturing process distributions and variations, environmental factors such as partial or non-uniform shading and soiling can also cause incident sunlight power variations among solar cells. Variable and non-uniform shading in the field is one primary root cause of these operational non-uniformity and cell-to-cell mismatch issues. To resolve this issue, a maximum power point tracking (MPPT) power optimizer device can be used at the output of each solar cell (or attached to the output of a plurality of interconnected solar cells within the module) to eliminate or mitigate the current mismatch issues within the solar PV module. A properly designed power management device (MPPT power optimizer) will optimally load or bias the cell (or a plurality of electrically interconnected solar cells) with the correct power point and deliver this maximum power to the system load allowing all cells or cell strings within the PV module to operate at or near their own respective Maximum Power Points. This is effectively accomplished in a solar PV module through distributed power optimization by using the multi-modal Maximum-Power-Point-Tracking (MPPT) integrated circuit chip which is covered by the PCT utility patent application number PCT/US16/63209 filed on Nov. 21, 2016, entitled: "Multi-Modal Maximum-Power-Point-Tracking Optimization Solar Photovoltaic System", claiming the benefit of U.S. provisional patent application 62/257,698 filed on Nov. 19, 2015. Interested readers are encouraged to review those disclosures for details.

The Maximum Power Point Tracking (MPPT) integrated circuit (IC) or chip, covered in the above-mentioned patent application, is designed for distributed DC power optimization and enhanced power harvesting of photovoltaic (PV) modules, by mitigating the detrimental impact of cell-to-cell effects. It regulates the power and performs maximum power optimization, at the granularity level of a partitioned solar cell or a plurality of interconnected solar cells. The multi-modal MPPT IC extracts the maximum available power from the solar cells for a wide range of operating conditions (including partial or full shading of any solar cells within the PV module) and delivers this power to the system or the load in a usable form. The distributed array of MPPT integrated circuit chips within the PV module also mitigate the detrimental effects of electrical current mismatches among the cells or cell strings controlled by the MPPT power optimizer chips within the PV module. It does this by placing a pass element (such as a pass transistor switch), in series with the cell or string of interconnected solar cells supervised and controlled by the MPPT chip, which connects to a cell string (or a string of partitioned smaller-area cells called sub-cells) and controls the on/off times (and/or switching duty cycle) which maximize PV power generation and extraction.

The Maximum-Power-Point Tracking (MPPT) power optimizer device is a one-way power transfer electronic device. Photo-generated electrical power or photovoltaic power is extracted from the solar cell (or a string of several interconnected solar cells or partitioned solar cells) and delivered to the load (the load may be an inverter, a charge controller, an appliance, a storage battery, etc.). At the end of solar cell and PV module manufacturing process flow, there are two widely-used end-of-the-line PV module electrical tests that can cause serious problems or even be hindered with this multi-modal MPPT power optimizer device. One commonly used end-of-the-line PV module testing is the so-called Electro-Luminescence test (also known as EL test which is an electro-optical test), and the other commonly used electrical test is called a flash current-voltage test (or also known as flash I-V test). The EL test applies a power supply across the PV module leads and drives a DC electrical current into the PV module leads (hence, driving the DC current through the solar cells, typically connected in electrical series, within the module such that the solar cell pn junctions are forward biased) while the module is in a relatively dark environment, and looks at the resulting electro-luminescence (EL) image of the array of solar cells embedded in the module laminate in order to evaluate the quality of the solar cells within the module. The EL current direction is the reverse of the PV module normal operating mode photogeneration current flow direction (while the voltage polarity of the module terminals is similar during both EL testing and normal photogeneration operation of the module). Therefore, the EL current flow direction is the reverse of the photo-generated current flow direction (hence, we call the EL current a reverse current since its current flow is opposite the photo-generated current flow direction). Without the add-on reverse current (i.e., any electrical current flow into the module and opposite the photo-generated current flow) protection and testability allowance of this disclosure, the multi-modal MPPT power optimizer integrated circuits can interfere with or obstruct this current flow within the module, and the reverse current can also cause permanent damage to the multi-modal MPPT integrated circuit chips attached to the solar cells within the module, hence, also permanently damaging the power generation capability of the PV module. During the flash I-V testing of the solar PV module a relatively dark room is used, the solar module is "flashed" (e.g., typically for a short period of time) with a solar light simulator (simulating the approximate sunlight intensity and spectrum, at full or a pre-specified fraction of the full sunlight intensity) and a current-voltage (I-V) sweep is done between the short-circuit (zero voltage across the module leads) and open-circuit (zero photo-generated module current) conditions on the module under flash test. Again, the MPPT integrated circuit chip(s) will interact with this test, and may interfere with the flash I-V testing, substantially distorting the flash I-V test results or even preventing the flash I-V testing operation. The chips will try to deliver constant or maximum power when the flash I-V tester is looking for a power-voltage curve. This action by the MPPT power optimizer device will interfere with the flash I-V testing and can cause the solar PV module to fail the test and the test results being distorted and inaccurate, hence, resulting in large measurement errors. As a result, there is a need for an electronic circuit solution, much preferably a modular add-on circuit which can be used in conjunction with the existing multi-modal MPPT integrated circuit chip, in order to enable low-resistance reverse current flow through the module to enable reliable EL testing without damage to the multi-modal MPPT integrated circuits, and also in order to allow flash I-V testing of the PV module without distorting the I-V curves.

SUMMARY

Disclosed herein are modular add-on electronic circuit structures and methods for providing protection against reverse-electrical-current failures and for enabling comprehensive electrical (current-voltage or flash I-V sweep generating normal photo-generated current flow) and electro-optical (electroluminescence or EL using reserve current flow) testing of solar photovoltaic cells and modules having at least one multi-modal maximum-power-point tracking (MPPT) power optimizer (or power maximizing) integrated circuit chip (referred to as MPPT power optimizer or power maximizing chip) to increase electrical energy generation yield of the modules. Such distributed MPPT power optimizer chips are used for distributed solar electric power generation enhancement in solar photovoltaic cells, modules, and systems under realistic operating conditions with non-ideal manufacturing and environmental variations (e.g., variable and/or non-uniform sunlight or daylight, mismatched solar cells, etc.).

Specifically, a solar photovoltaic (PV) module is disclosed for distributed solar electric power generation, the module comprising: a plurality of strings of solar cells, each string comprising a plurality of solar cells electrically connected together, a positive lead and a negative lead; and, a plurality of multi-modal maximum-power-point tracking (MPPT) integrated circuits (IC) having input terminals and output terminals, such that each string of solar cells is connected to the input terminals of a corresponding MPPT IC via the string's positive and negative leads; wherein the plurality of MPPT ICs are enhanced with add-on electronic circuits for protection of the corresponding MPTT IC and for enabling flash I-V testing of the module.

Also disclosed are printed circuit boards (PCBs) or monolithic IC chips from integrating the add-on electronic circuitry with the MPPT ICs, either on printed circuit boards or PCBs, or on monolithic integrated circuits.

BRIEF DESCRIPTION OF THE DRAWINGS

The following description and associated figures teach illustrative embodiments of the disclosure. For the purpose of teaching inventive principles, some conventional aspects of the illustrative examples can be simplified or omitted. The claims should be considered as part of the disclosure. Note that some aspects of the best mode may not fall within the scope of the disclosure as specified by the claims. Thus, those skilled in the art will appreciate variations from the claimed embodiments that fall within the scope of the disclosure. Those skilled in the art will appreciate that the features described below can be combined in various ways to form multiple variations of the disclosure. As a result, the disclosure is not limited to the specific examples described below.

Please note that in the figures, relative dimensions are not shown to scale.

FIG. 13A shows the typical representative electrical and timing parameters of a bypass circuit of this disclosure.

FIG. 13B lists the values and parts numbers used in the circuit of FIG. 12. Note that other equivalent parts from other manufacturers may also be used.

FIG. 17 shows a table listing results of flash current-voltage (I-V) testing of half-module sections having the MPPT chips and add-on circuits of this disclosure.

FIG. 32 illustrates pin descriptions of the multi-modal MPPT IC chip of FIG. 30 capable of operating with the add-on circuit of this disclosure.

FIGS. 34A and 34B show respectively absolute maximum ratings and recommended operating conditions of the multi-modal MPPT IC chip capable of operating with the add-on circuit of this disclosure.

FIG. 35 shows electrical characteristics of the multi-modal MPPT IC chip capable of operating with the add-on circuit of this disclosure.

FIGS. 36A and 36B respectively show schematic side view and bottom view with the dimensions in the table in FIG. 36C, for the multi-modal MPPT IC chip capable of operating with the add-on circuit of this disclosure.

DETAILED DESCRIPTION OF THE EXEMPLARY EMBODIMENTS

Figure 1:
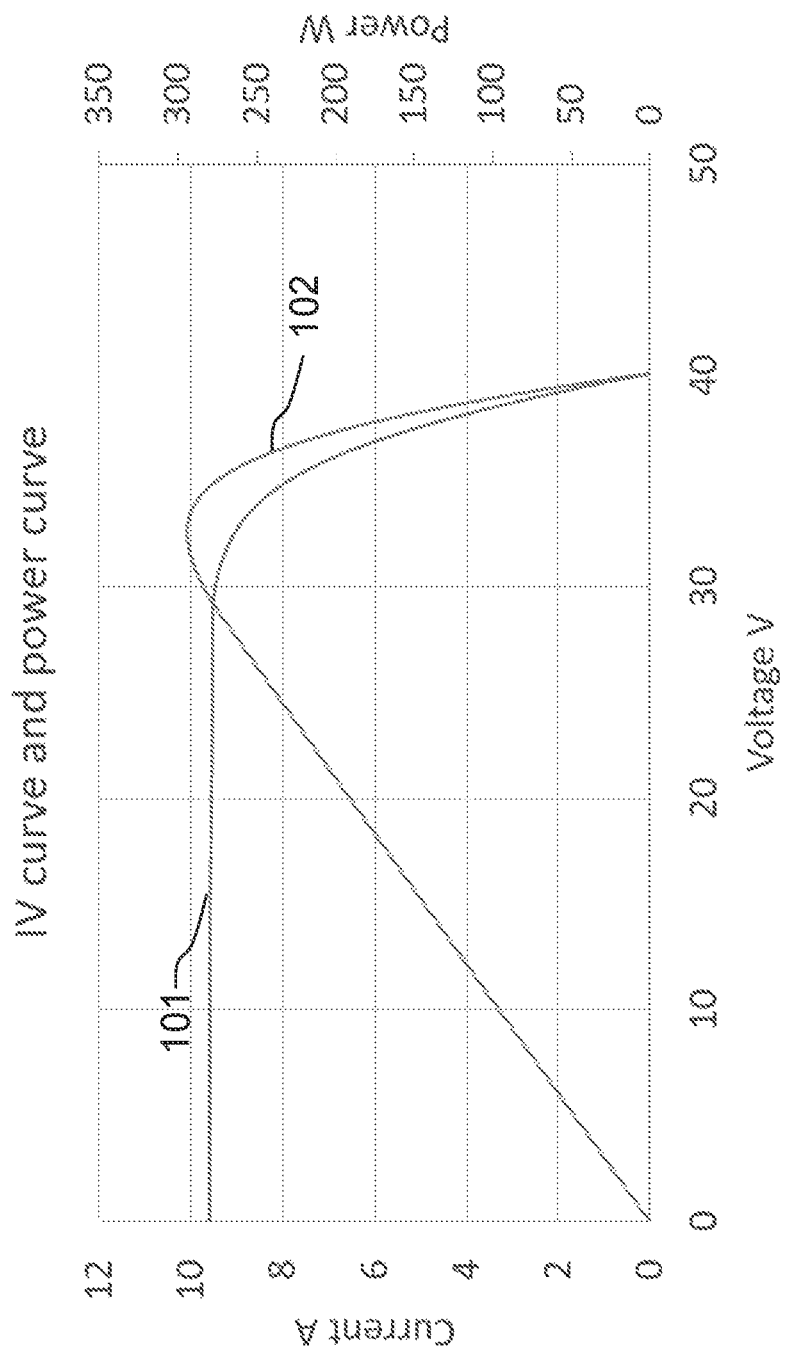
FIG. 1 is a representative example of crystalline silicon solar PV module current-voltage (I-V) and power-voltage (P-V) curves.

Embodiments of the present disclosure will now be described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements.

Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure. In the present specification, an embodiment showing a singular component should not be considered limiting; rather, the disclosure is intended to encompass other embodiments including a plurality of the same component or nested stages, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

Physical dimensions, directionality, shapes, voltages, currents, power generation amounts, number of sub-components used in a bigger component are not limiting to the scope of the disclosure. They are used in the illustrative examples to facilitate the reader grasp the inventive concept.
The Multi-Modal Maximum-Power-Point-Tracking (MPPT) Power Optimizer Integrated Circuit The multi-modal Maximum-Power-Point-Tracking (MPPT) integrated circuit (IC) or chip (covered in the related PCT utility patent application number PCT/US16/63209) is designed for distributed DC power optimization and enhanced power harvesting and power maximization of solar photovoltaic (PV) modules, by detecting and mitigating the detrimental impact of cell-to-cell (or cell string to cell string) parametric mismatches due to various root causes such as manufacturing non-uniformities, irradiance non-uniformities, and various environmental shading effects. It regulates the photovoltaic power and performs maximum power optimization, at the solar cell level (or alternatively at the level of one multi-modal MPPT chip per string of a plurality of interconnected solar cells). The multi-modal MPPT IC extracts the maximum or near-maximum available photovoltaic power generation from the solar cells for a wide range of operating conditions (including partial or full shading of various solar cells embedded within the PV module, at different times from sunrise till sunset with different levels of irradiance intensities, and at various ambient temperatures) and delivers this power to the system or the load in a usable form. The distributed array of multi-modal MPPT integrated circuit chips attached to the groups or strings of solar cells or partitioned reduced-area solar cells within the solar PV module also mitigate or eliminate the detrimental effects of various electrical parametric mismatches among the solar cells or solar cell strings controlled by the multi-modal MPPT power optimizer (power maximizing) integrated circuit chips associated with and electrically connected to the solar cells within the solar PV module. It does this by placing a pass element or an electronic switch (such as a field-effect transistor switch), in series with the solar cell or string of plurality of electrically interconnected (in electrical series or hybrid parallel-series) solar cells attached to and controlled by the multi-modal MPPT integrated circuit chip, which connects to a string (of solar cells or partitioned solar cells) and controls the on/off times (or the transistor switching duty cycle at a given switching frequency) which maximizes PV power extraction from the solar cells.

A typical PV module comprising a plurality (e.g., N, wherein N may be 60 or multiples of 60 including: 120, 180, 240, etc.), 72 (or multiples of 72 including: 144, 216, 288, etc.), 96, or any other number) of solar cells or partitioned solar cells may use a plurality (e.g., M) of multi-modal MPPT chips. Both N and M are typically integers greater than 2, and N may be equal to M or an integer multiple of M. For instance, a standard-format 60-cell solar module has N=60 full-size crystalline silicon solar cells. Alternatively, such module may use N=120 half-cells (i.e., when each solar cell is partitioned into two half cells to reduce the module current and ohmic losses), 180 one-third cells (i.e., when each solar cell is partitioned into three one-third cells to reduce the module current and ohmic losses), etc. As an example, a 120-half-cell module (N=120) may use M=12 multi-modal MPPT chips (with one multi-modal MPPT chip per 10 half-cells connected in electrical series). In another example, a solar PV module may use 144 half cells (N=144) and 12 multi-modal MPPT chips (M=12), with one multi-modal integrated circuit MPPT chip per 12 series-connected half-cells. Many other solar cell partitioning and interconnection layouts and combinations are possible. The multi-modal MPPT integrated circuit maintains the solar cell power (or the power of a string of series-connected or hybrid series/parallel-connected solar cells or partitioned solar cells) at or relatively near its maximum-power point (MPP) regardless of the cell shading conditions, environmental irradiance and temperature conditions, and current draw required by the system.

Figure 2:
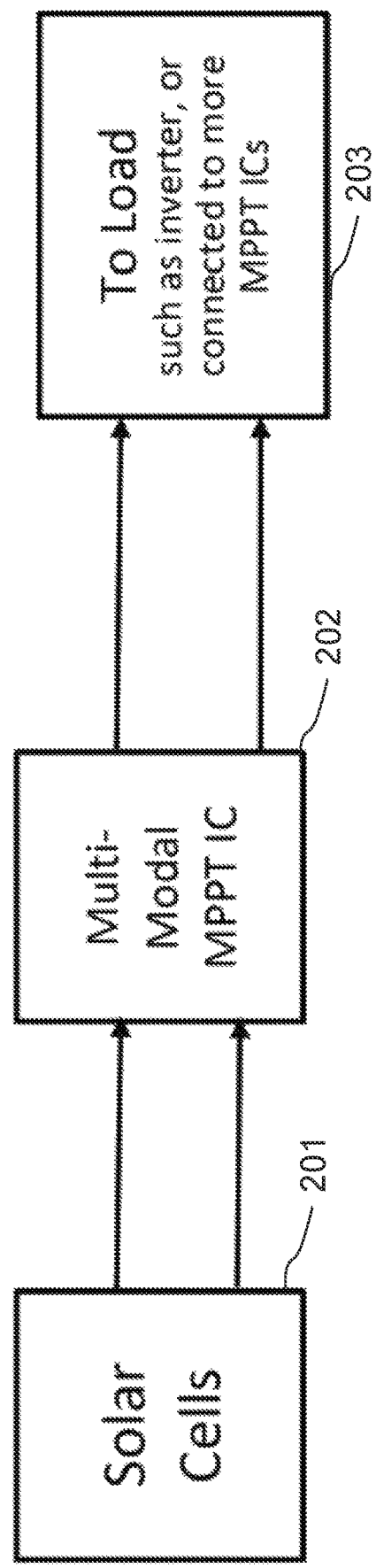
FIG. 2 shows a Multi-Modal Maximum-Power-Point Tracking (MPPT) Integrated Circuit used for maximum-power generation and harvesting of solar modules.

The output of the multi-modal MPPT circuit is a current-matched maximum power from the cell or plurality of interconnected cells associated with the MPPT chip. This is good for a PV system in the field (for maximizing photovoltaic energy yield and reducing levelized cost of electricity or LCOE) but can cause some problems and constraints during testing of the PV modules comprising distributed such multi-modal MPPT chips. FIG. 2 shows a typical schematic connections diagram for a solar cell or plurality of electrically interconnected solar cells 201, multi-modal MPPT IC 202, and connection to the rest of the system. The multi-modal MPPT IC 202 may be connected to load or connected to more multi-modal MPPT ICs (in electrical series or hybrid series-parallel), as shown in the block 203.

Reverse-Current-Flow Electro-Luminescence (EL) and Voltage Sweep Flash Current-Voltage Tests There are two primary scenarios of interest where the multi-modal MPPT integrated circuit can interfere with solar module operation during testing for the solar PV module performance and quality testing and evaluations. These two scenarios include the electro-luminescent test (also known as EL test) and a flash current-voltage sweep test (also known as flash I-V test). The flash I-V sweep testing of a solar PV module is commonly performed using a commercially available flash I-V tester having a large-area (to illuminate the entire PV module area) solar simulator for PV modules. Flash I-V testing of a solar PV module measures its I-V curve, electrical parameters such as the module open-circuit voltage (Voc or module voltage at zero current) and short-circuit current (Isc or module current at zero voltage), and the module electrical power output vs module voltage varied between 0 (at maximum current Isc) and the open-circuit voltage (or maximum module voltage at zero current), at known simulated sunlight irradiance levels (for instance, at 1 sun and/or at fractions of 1 sun). The results of flash I-V testing of manufactured PV modules are used to check the power performance and quality of the PV modules and to bin the modules based on their maximum output power levels prior to shipping them to customers.

a. Reverse-Current Flow During the Electro-Luminescence (EL) Module Test

Figure 3:
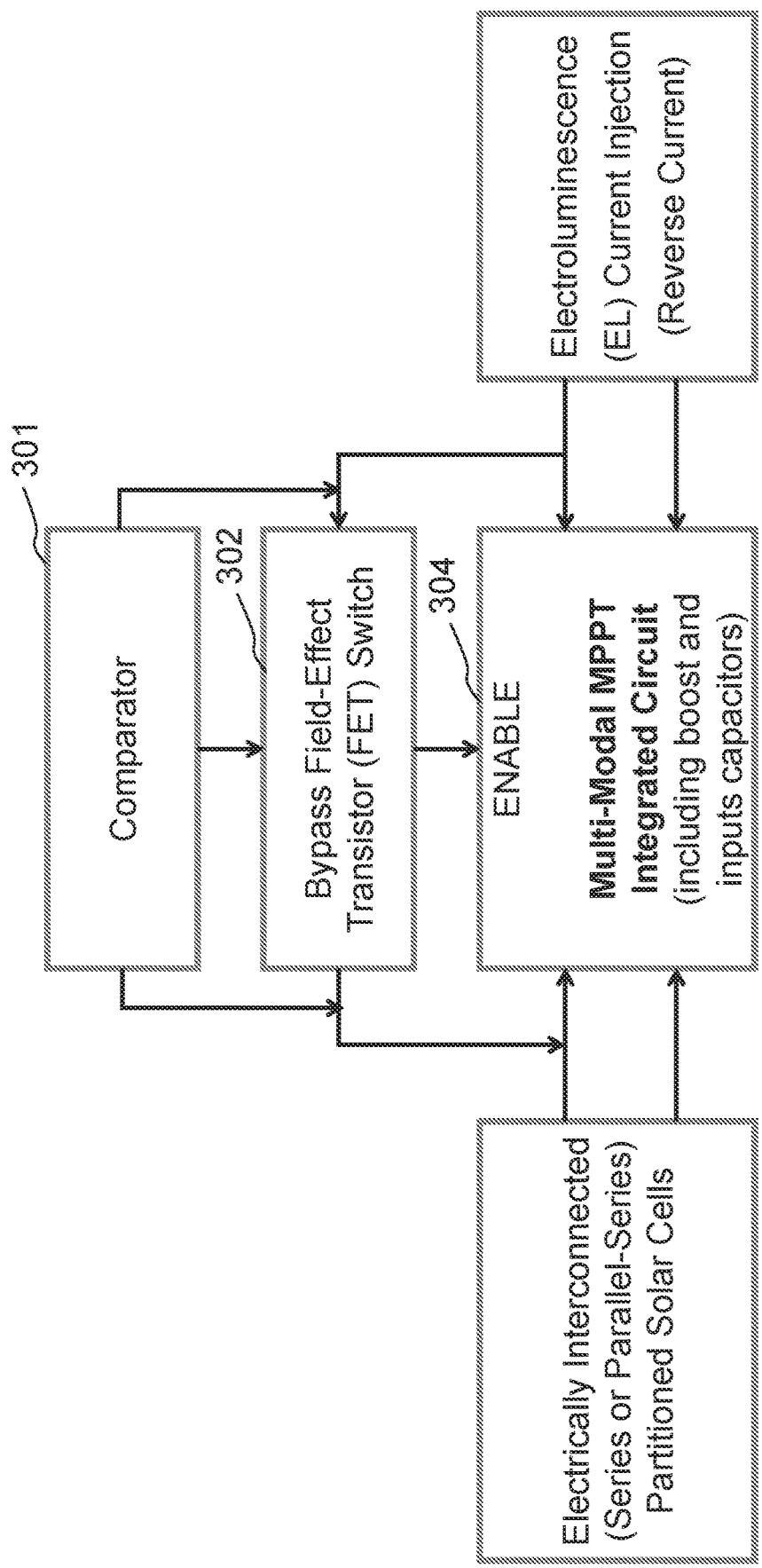
FIG. 3 shows a block diagram of modular add-on bypass Field-Effect Transistor (FET) switch and comparator creating an active bypass circuit for the reverse current flow and protection of the MPPT IC.

FIG. 3 shows a block diagram of modular add-on Bypass Field-Effect Transistor (FET) and Comparator creating an active bypass circuit for the reverse current flow and protection of the multi-modal MPPT IC. Electroluminescence test is performed to check the overall quality and health of the solar cells within a PV module. EL testing can identify inferior solar cells and or non-equal solar cells (such as solar cells with cracks, poor minority carrier lifetimes, degraded efficiencies, etc.), and any defective solar cells with dead zones and/or reduced conversion efficiencies. During EL testing, an electrical current is injected via the module electrical leads into the solar panel in the direction opposite the normal photo-generation current flow direction (with the current driving the semiconductor pn junctions of the solar cells in the module into their forward-bias condition) in a relatively dark room and the resulting luminance from the embedded solar cells in the laminate is photographed over the entire module area. The first generation of the multi-modal MPPT integrated circuit has not been designed to enable the flow of a reverse current with minimal resistance and without damaging the multi-modal MPPT chip itself, since this is not a normal photo-generation operating condition for the solar PV module (for which the multi-modal MPPT integrated circuit chip is designed). As part of this disclosure, a bypass circuit, much preferably an active bypass circuit, which detects a reverse electrical current flow condition (i.e. an electrical current flow opposite the direction of the normal photo-generation current flow in the module), and bypasses the multi-modal MPPT chip during the reverse current flow is the most logical and practical solution. This will allow for a very low-resistance reverse current flow path into the solar cells, fully bypassing and protecting the multi-modal MPPT integrated circuits attached to the solar cells in the module. FIG. 3 shows an add-on circuit of this disclosure having bypass field-effect transistor (FET) switch 302 and comparator reverse-current flow detector 301 connected to the input and output terminals of the multi-modal MPPT IC with an ENABLE pin or lead 304, with said add-on circuit also controlling the voltage of said ENABLE pin (Note: When performing EL testing, a DC power supply such as a current source is connected across the module power leads instead of a load such as charge controller or inverter). The voltage state of the ENABLE pin can either ENABLE the multi-modal MPPT IC to operate normally (for instance, when the ENABLE pin voltage is set to HIGH or 1), or disable its function and effectively turning it off (for instance, when the ENABLE pin voltage is set to LOW or 0).

b. Flash Current-Voltage (I-V) Sweep Test

During the flash current-voltage (I-V) module sweep test, the voltage can either be a sweep from the short circuit condition (i.e., Isc or short-circuit current with zero module voltage) to the open-circuit condition (Voc or open-circuit voltage at zero module current) or a reverse sweep from the open-circuit condition (Voc or maximum module voltage at zero module current) to the short-circuit condition (Isc or maximum module photo-generated current at zero module voltage). In either case, the multi-modal MPPT integrated circuit (without the add-on active bypass circuit of this disclosure) interferes with this flash I-V sweeping condition as it attempts to regulate and maintain the associated solar cells or sub-cells at or near their maximum-power-point (MPP) operating point during the sweep condition, yet the flash I-V test requires the complete undisturbed current (and power) vs voltage (between 0 and open-circuit voltage) curves (i.e., both current-voltage or I-V and power-voltage or P-V curves) of the PV module under flash test, without any interference from the multi-modal MPPT power optimizer chip (i.e., the multi-modal MPPT integrated circuit must be effectively disabled to prevent its normal function during the flash I-V and P-V test). According to the modular add-on solution of this disclosure, a short-circuit detect and/or a start-up timing circuit that turns on an MPPT bypass circuit and disables the multi-modal MPPT integrated circuit for a specified finite/known period of time is provided.

Figure 4:
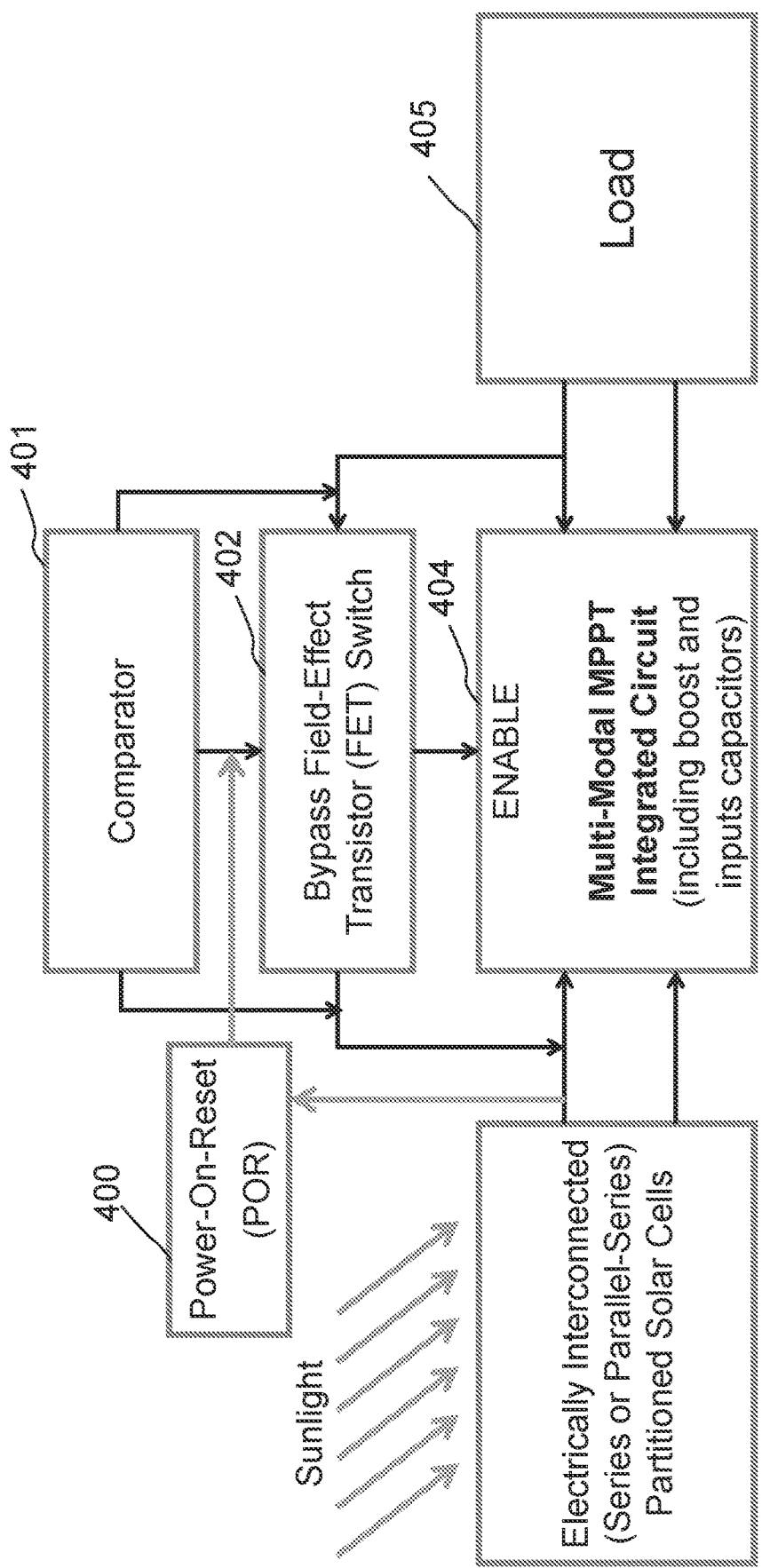
FIG. 4 shows how a Power-On-Reset (POR) circuit in added and connects into the block diagram similar to the block diagram of FIG. 3 for an added function to enable flash I-V testing of PV module.

As shown in FIG. 4, a Power-On-Reset (POR) circuit 400 is used to prevent and delay the multi-modal MPPT integrated circuit from turning on or operating as a power optimizer (by disabling the multi-modal MPPT chip), and to turn on the bypass switch device (such as a bypass field-effect transistor or FET) during the flash I-V sweep test start up. As shown in FIG. 4, the solar cells in the module are flashed with light (e.g., the flash I-V tester solar simulator) and the load 405 is swept from a short circuit (zero module voltage condition) to an open circuit (zero module current condition) while the resulting module current and voltage values are measured during the entire module voltage sweep.

Electro-Luminescent or EL Test (Reverse-Current EL Test)

The EL test is done at room temperature and under no light or negligible light condition (under total darkness or very low light condition). It requires a DC current of sufficient magnitude (with the magnitude of the EL current typically being in the range of between a fraction of and up to about 1.5 times the 1-sun short-circuit photo-generation current of the PV module), for instance, about 6 amps of DC current, to be injected into the PV module or panel in the reverse or opposite direction the module photo-generated current flow (by connecting the PV module terminals to an external DC power source, such as a DC current source with sufficient power rating). This arrangement will force the voltage to rise to slightly higher than the module photo generation voltage (by driving each solar cell semiconductor pn junction into the forward bias condition). This reverse current will flow back through the multi-modal MPPT integrated circuits connected to the strings of solar cells in the module. Under normal operating operation, the voltage on the output of the multi-modal MPPT integrated circuit chip would always be lower than the solar cell voltage (or the voltage of the string of interconnected cells associated with and attached to the input terminals of the multi-modal MPPT power optimizer integrated circuit chip) into the multi-modal MPPT IC (the cell voltage or the cell string voltage) but during the reverse current condition the voltage will rise above the cell voltage (or the photo generation open-circuit cell voltage). When this reverse-current-flow condition happens (such as during EL testing, or during any unintended and undesirable reverse current flow), the bypass device must be automatically turned on to prevent the electrical current from flowing through the multi-modal MPPT integrated circuit (otherwise, this reverse current flow would likely permanently damage the multi-modal MPPT integrated circuit chip). The multi-modal MPPT IC must also be turned off or disabled to prevent it from running and functioning normally during the bypass period (e.g., during the EL testing). Note during the EL testing, the PV module is connected to a DC power supply such as a DC current source or power supply (not to a load) to inject a DC current into the PV module (through the Bypass FET circuit of this disclosure). The EL current flow direction is opposite the normal photo-generation current flow when the PV module receives sunlight and is connected to a load such as an inverter.

Comparator Circuit

Figure 5:
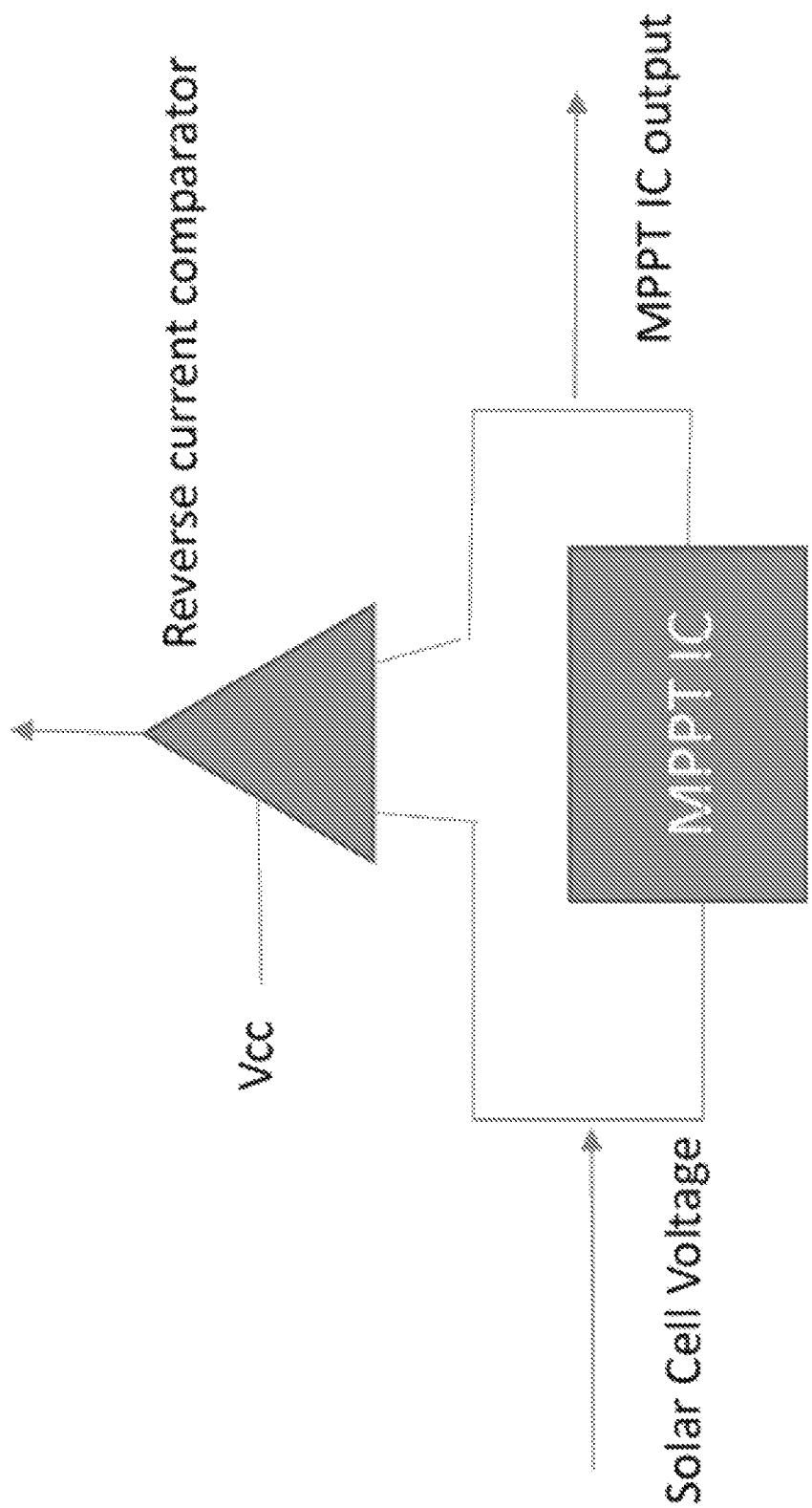
FIG. 5 shows a comparator reverse current flow detector connected to the MPPT integrated circuit chip.
Figure 6:
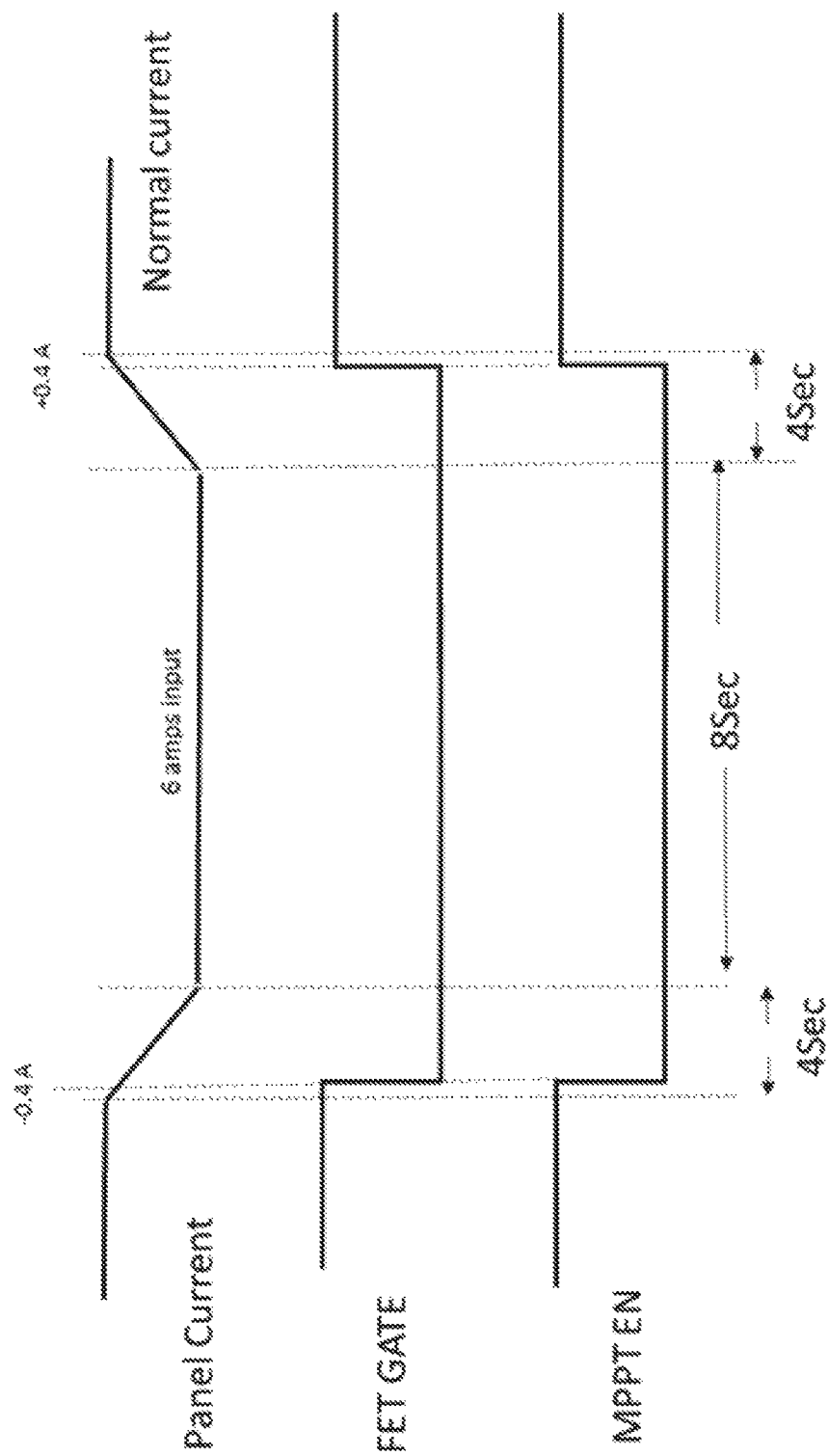
FIG. 6 shows a representative timing diagram of reverse current flow vs FET gate and multi-modal MPPT Enable (EN) for the add-on circuit of this invention. Note that the ENABLE pin on the MPPT chip can enable or disable the MPPT chip function by the applied voltage on it being high or low.

The comparator circuit shown in FIG. 4 and FIG. 5 is used to detect a rise in the output voltage above the solar cell voltage (or the solar cell string voltage when the multi-modal MPPT integrated circuit chip is associated with a string of electrically interconnected solar cells). It should be able to work with voltages above its power rail. The comparator power supply voltage (shown as Vcc) must be taken from the solar cell voltage (or the electrically interconnected cell string voltage) because the multi-modal MPPT integrated circuit output can be either cell voltage (or electrically interconnected cell string voltage) or zero voltage and cannot be used on as Vcc for the comparator. There needs to be a DC current offset (for instance, a DC current offset of about of 0.2 A, current into the multi-modal MPPT integrated circuit from the PV module output side). For enhanced noise immunity, a hysteresis current (for instance, about 0.4 A) needs to be added to prevent chattering. Moreover, a filter to prevent noise from running the multi-modal MPPT integrated circuit is needed. For instance, 2 MHz filtering will prevent switching edges from false tripping the comparator (assuming the multi-modal MPPT integrated circuit DC-DC switching at a frequency of about 500 kHz). The timing of a representative electroluminescence (EL) test is shown in FIG. 6. "MPPT EN" refers to the ENABLE pin voltage of the multi-modal MPPT integrated circuit during the test. The ENABLE pin voltage is zero during the EL testing period (hence, disabling the multi-modal MPPT integrated circuit, while the p-channel FET bypass switch is turned on.

Field-Effect Transistor (FET) Bypass Switch

Usually, the electroluminescence (EL) test uses a maximum current of up to about 1.5 times the 1-sun photo-generation current of the PV module (for instance, up to about 6 amps when the multi-modal MPPT integrated circuit is designed for up to about 4 A of cell string current, as is the case for the multi-modal MPPT integrated circuit chip used with the add-on circuits of this disclosure) to test the PV module. This reverse current flow during EL testing (for instance, 6 A of EL current) must be bypassed from the multi-modal MPPT integrated circuit using the bypass Field-Effect Transistor (FET). When turned on, the FET series resistance must be as low as possible to reduce the $I^2R$ power dissipation ohmic losses during the EL test period. The EL test ramps up the current from 0 A (no current flow) to the nominal EL test current (for instance, up to about 6 A) in a finite period of time (for example, in about 4 seconds), stays at the EL test current value (e.g., at about 6 A) for a specified period of time (for instance, for about 8 seconds), then ramps down to zero current in a few seconds (e.g., in about 4 seconds), with a total EL test time of less than about 30 seconds (for instance, for a total EL test time of 16 seconds for the EL test example shown). For reduced resistive losses, 20 milli-ohms FET resistance at room temperature is preferably required to prevent overheating during the EL testing. Gate threshold voltage of the FET should preferably be about 2V or less so the device can operate in a low voltage situation during the EL test sweep.

Power-On-Reset (POR) Circuit—Flash I-V Sweep Test

Figure 7:
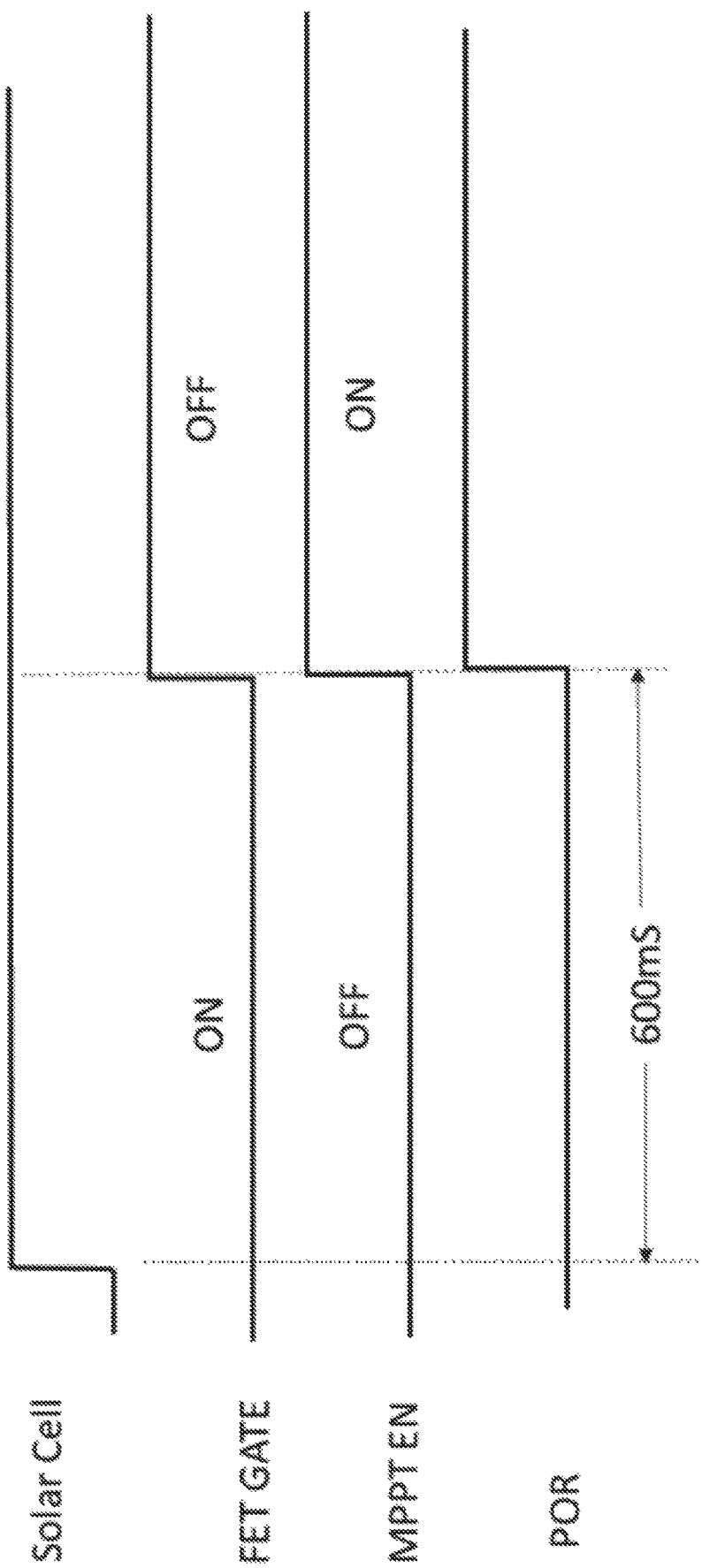
FIG. 7 shows a representative timing diagram for multi-modal MPPT Enable (EN) and Field-Effect Transistor (FET) switch gate for the add-on circuit of this invention.

For the flash current-voltage (I-V) sweep test, the solar module is placed in a relatively dark room and is flashed with light from a solar simulator at a one-sun light intensity (and at times at a fraction of one-sun light intensity to determine the low-light performance of the PV module). The module voltage across its external terminals is then swept from 0 V (corresponding to short-circuit current Isc) up to the maximum open-circuit voltage (Voc), when zero module current flows. The flash I-V tester performs this voltage sweep in a relatively short period of time, for instance, in approximately 200 msec (i.e., 0.200 second). The Power-On-Reset (POR) circuit will keep the multi-modal MPPT integrated circuit chip OFF (or disabled by setting the voltage of its ENABLE pin at a zero or LOW voltage) and the Bypass FET switch ON during this test time so the flash I-V tester can test the PV module without multi-modal MPPT integrated circuit power optimization disturbing the flash I-V testing of PV module. See FIGS. 7 and 8 for the representative timing diagrams of the solar cell (or string of solar cells attached to the input of the multi-modal MPPT IC) voltage, POR voltage, FET Gate voltage, and multi-modal MPPT integrated circuit chip ENABLE pin voltage.

Figure 8:
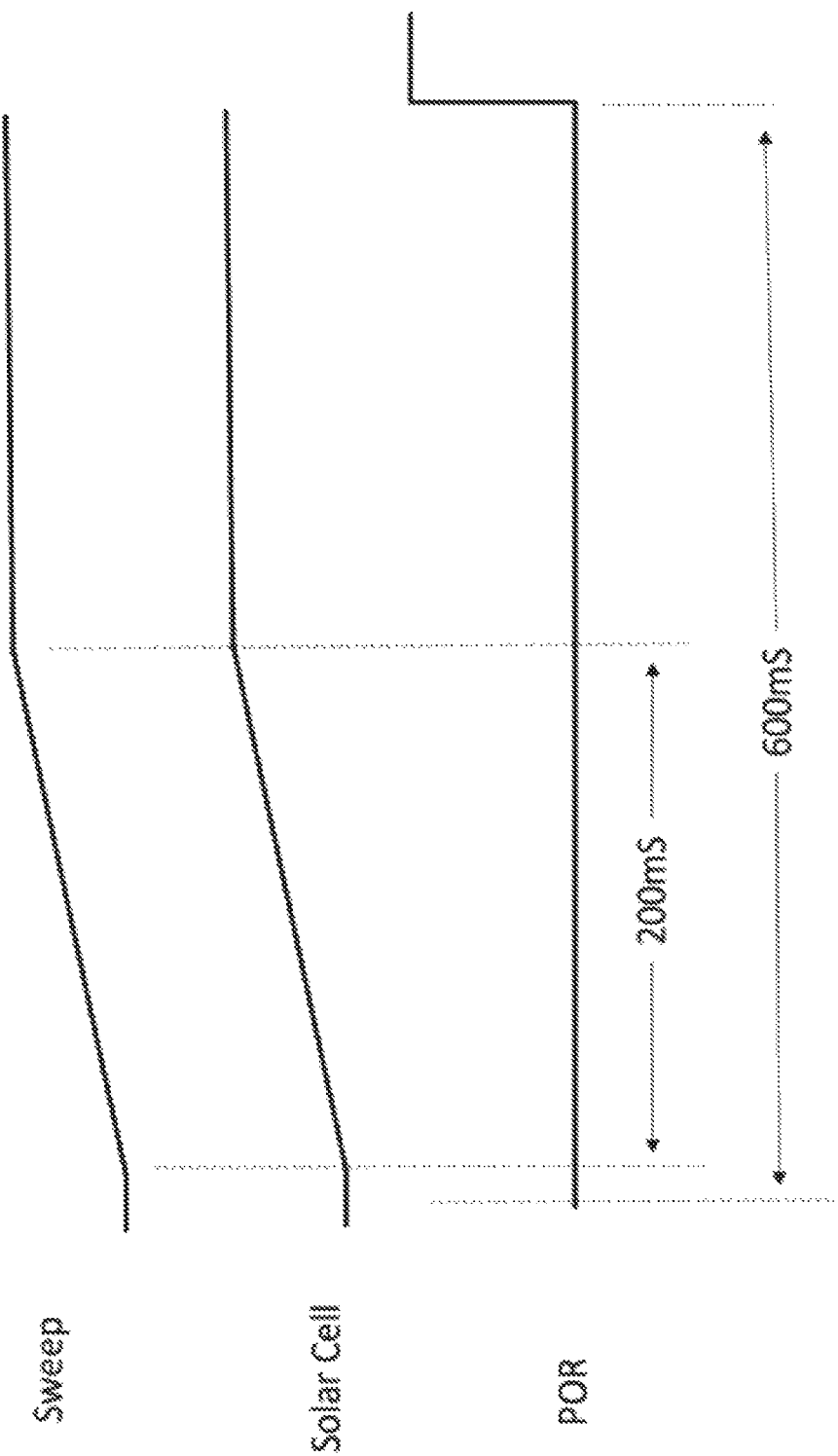
FIG. 8 shows a representative timing diagram for the Power-On-Reset (POR) circuit of this invention including flash current-voltage (I-V) test.

The start-up timer for the POR is preferably set to about three times the flash I-V test time (e.g., about 600 ms or 0.6 sec) permitting the test to finish with sufficient margin without multi-modal MPPT integrated circuit disturbance (with some added timing safety factor). The POR circuit needs to work down to about 2 V so it can be active during the module shorting period of the sweep test. The POR circuit, in conjunction with the FET needs to have a 2 V reset trip point. In FIG. 8, the sweep voltage of the panel is shown. Table 1 (FIG. 13A) shows the typical representative parameters of a bypass circuit of this disclosure.

Active Bypass Circuit Implementation a. Comparator

Figure 9:
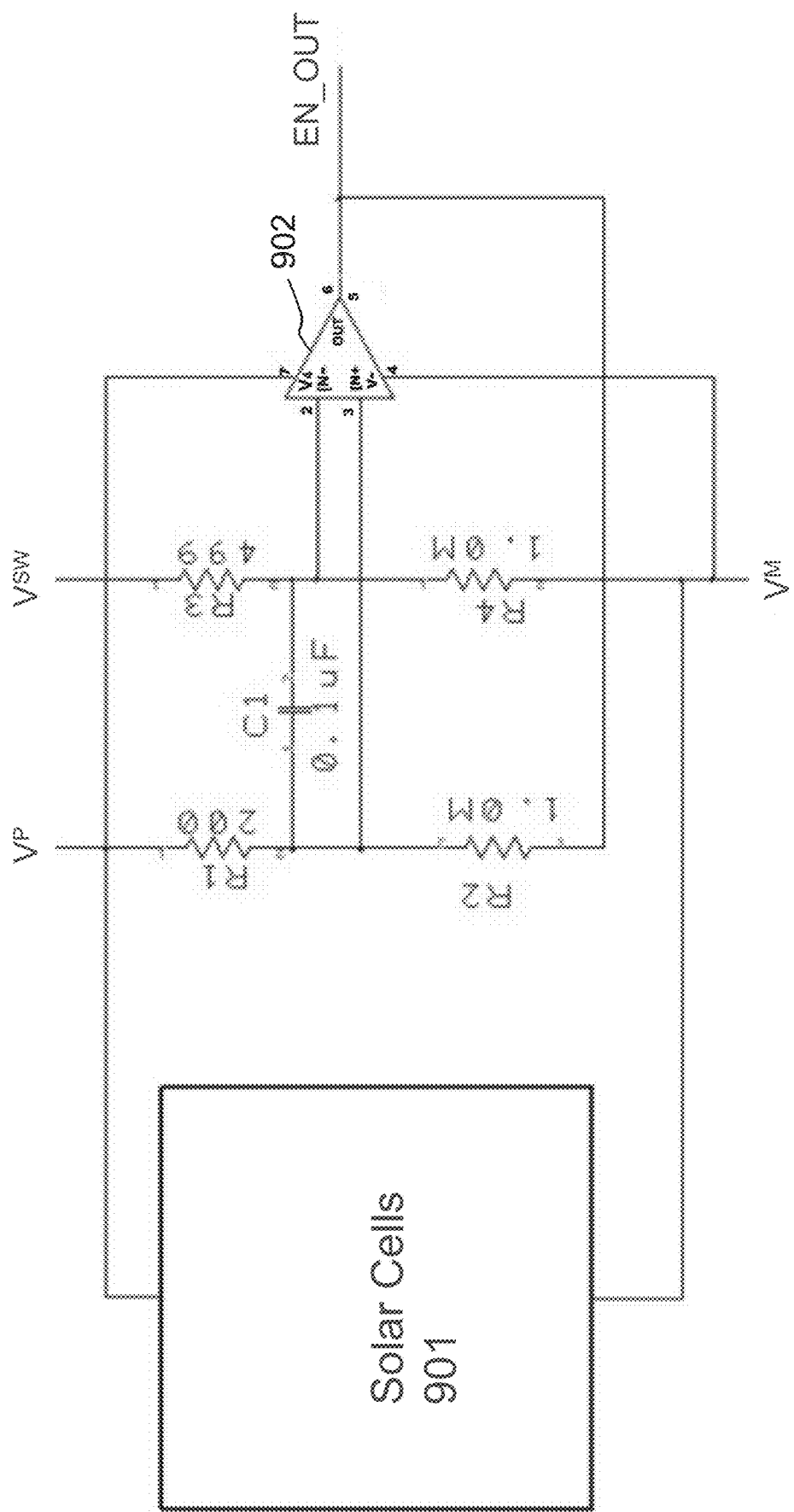
FIG. 9 shows a representative schematic circuit diagram of reverse-current flow detector (comparator) of this invention.

The modular add-on circuit design of this disclosure consists of three parts or building blocks: comparator, power-on-reset (POR), and p-channel field-effect transistor (P-CH FET) and its driver. The comparator needs to sense the solar cell (or string of interconnected solar cells) voltage (Vp) and the output of the multi-modal MPPT integrated circuit (Vsw or V switch). When reverse current flow happens (for instance, during EL testing), there are two scenarios that may occur in the multi-modal MPPT integrated circuit. In one scenario, the internal switch is on and the current is dropped or flows across the switch resistance of about 16 milli-ohms. In the second scenario, the switch is off and the current flows through the parasitic diode resulting in approximately 0.6 V rise above Vp. The comparator will trip when the Vsw (output of the multi-modal MPPT integrated circuit) rises above the voltage of the solar cell (or the string of interconnected solar cells). A small offset voltage of about 2.5 mV is implemented to make sure the reverse current is an accrual event. The R3 and R4 voltage divider (R3 and R4 are resistors) creates this offset. Resistor R2 creates a hysteresis. When the comparator trips (i.e., the output is low), resistor R2 pulls the negative input a little lower by about 1 mV. FIG. 9 shows the comparator connected to the solar cell block. Vp is the solar sell (or string of interconnected solar cells) sense point and Vsw is the output of the multi-modal MPPT integrated circuit chip which will rise above Vp when there is reverse electrical current flow. In the REVERSE CURRENT section of the additional figures attached to this document, it can be seen that the comparator switched from normal operation to reverse mode.

b. Field-Effect Transistor (FET) Switch and Driver

Figure 10:
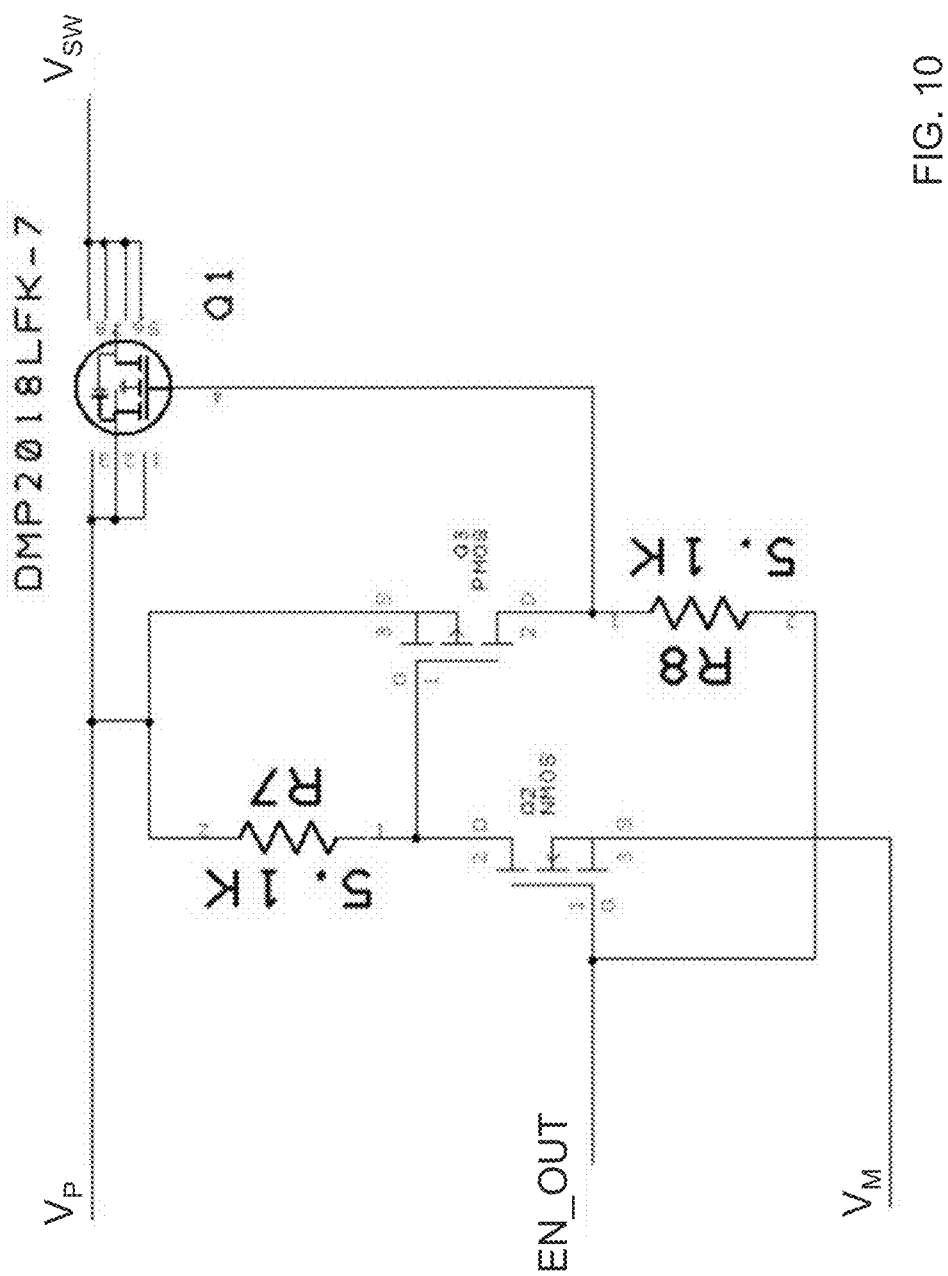
FIG. 10 shows a representative schematic circuit diagram of bypass power Field-Effect Transistor (FET) switch and gate driver of this invention.

In order to protect the multi-modal MPPT integrated circuit chip from reverse current flow and to permit flash I-V testing, a low-resistance FET switch is used as a bypass or protection circuit for the multi-modal MPPT integrated circuit chip (see Q1 in FIG. 10). When a power on reset (POR) condition or a reverse current is detected, the multi-modal MPPT integrated circuit is disable or turned off (through its ENABLE pin being at a low voltage) and the p-channel FET (PCH FET) is turned on thus bypassing and protecting the multi-modal MPPT integrated circuit chip. Q1 is preferably a 20 V and 13 A field-effect transistor (FET) with about 16 mΩ of internal ON resistance. Q2 is used to keep the bypass FET off during normal multi-modal MPPT integrated circuit operation, and Q3 drives Q2 on and off. In the Bypass FET Driver section of the additional figures provided with this document, it can be seen that the driver is working during the multi-modal MPPT integrated circuit normal operation and power optimization mode.

c. Power-On-Reset (POR) Circuit

Figure 11:
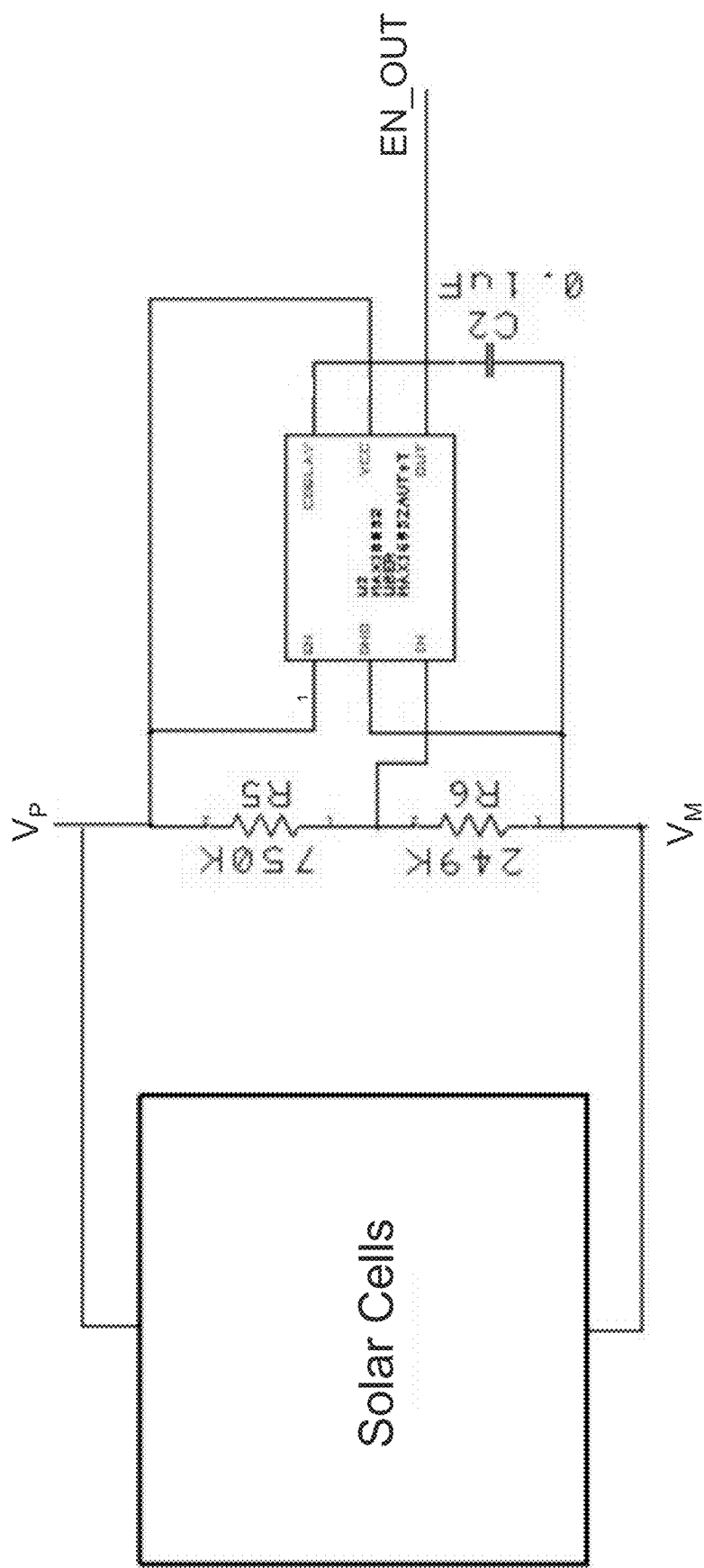
FIG. 11 shows schematic diagram of an embodiment of the Power-On-Reset (POR) circuit of this invention.

The Power-On-Reset (POR) circuit is used to detect when there is a startup condition such as during a flash current-voltage (I-V) test. As an example, a MAX16052 integrated circuit, see FIG. 11, is used to implement this important function in order to enable distortion-free flash I-V testing. Resistors R5 and R6 set the POR trip point to about 2 V. When the solar cell (or string of interconnected cells) voltage is under 2 V the POR will hold the bypass FET on, and when the voltage rises above 2 V, the POR circuit will timeout and turn off the bypass FET. C2 is the timing capacitor and the timing is set to be about 400 milli-seconds (400 ms or 0.40 second). For further details, see the Power-On-Reset (POR) figures in the additional figures of the attached figures document.

d. Schematic and Parts

Figure 12:
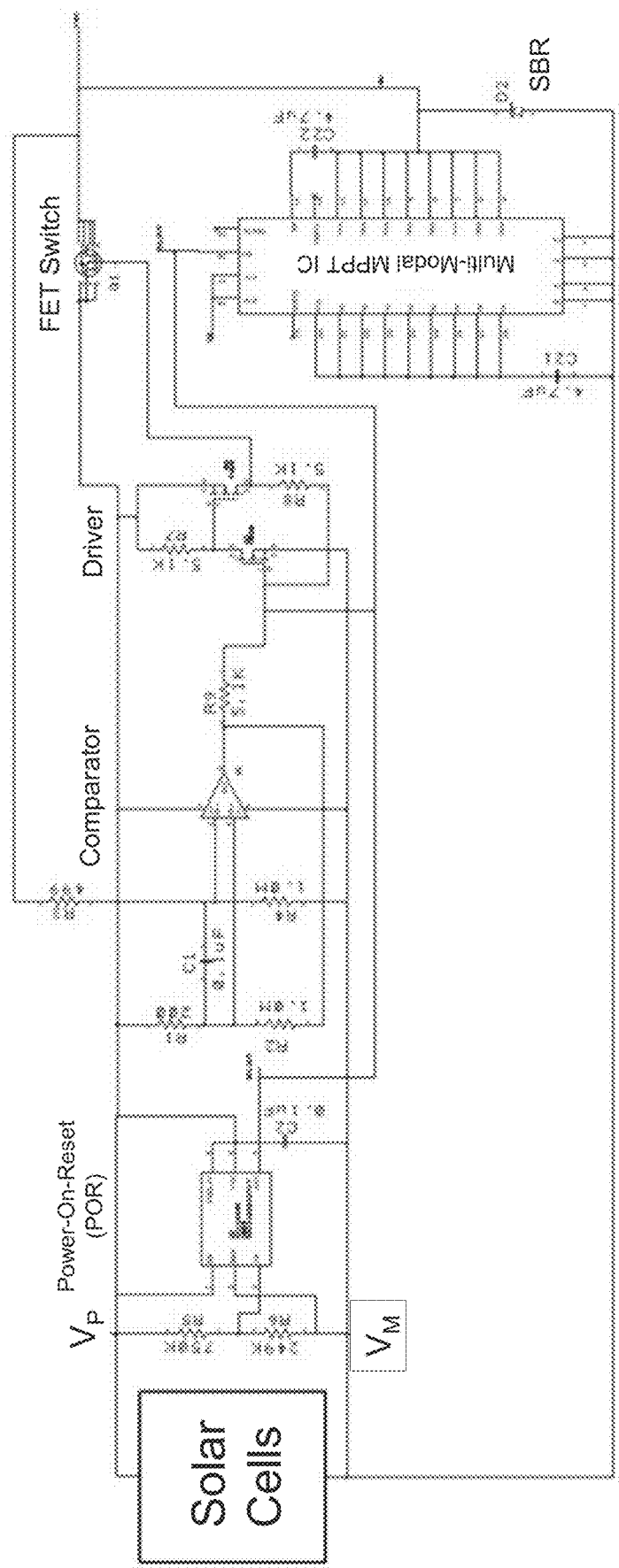
FIG. 12 shows a representative full schematic diagram of the multi-modal MPPT integrated circuit chip with the modular add-on active bypass circuit (or reverse-current protection and testability circuit) of this disclosure, including the added POR circuit to enable flash I-V testing of PV module.

FIG. 12 shows the full schematic circuit diagram of the modular add-on active bypass circuit solution of this disclosure (this is a representative implementation and embodiment of this disclosure and other circuit implementations are possible based on the concepts of this disclosure). Vp is the positive output of the string of interconnected solar cells, and Vm is the negative output of the string of interconnected solar cells. Between Vp and the output is the multi-modal MPPT integrated circuit chip. The output of the multi-modal MPPT integrated circuit is Vsw (switch node). Note the sensing feedback from Vsw to resistor R3 and the comparator. Table 2 (shown in FIG. 13B) lists the representative values and parts numbers used in this design (for a representative embodiment of this disclosure). Persons skilled in the art will readily recognize that the scope of the disclosure is not limited by these particular part numbers (P/N) or manufacturers or parameter values listed in the table.

Multi Modal MPPT IC and Add-On Circuit Implemented on Printed Circuit Board (PCB)

Figure 14A:
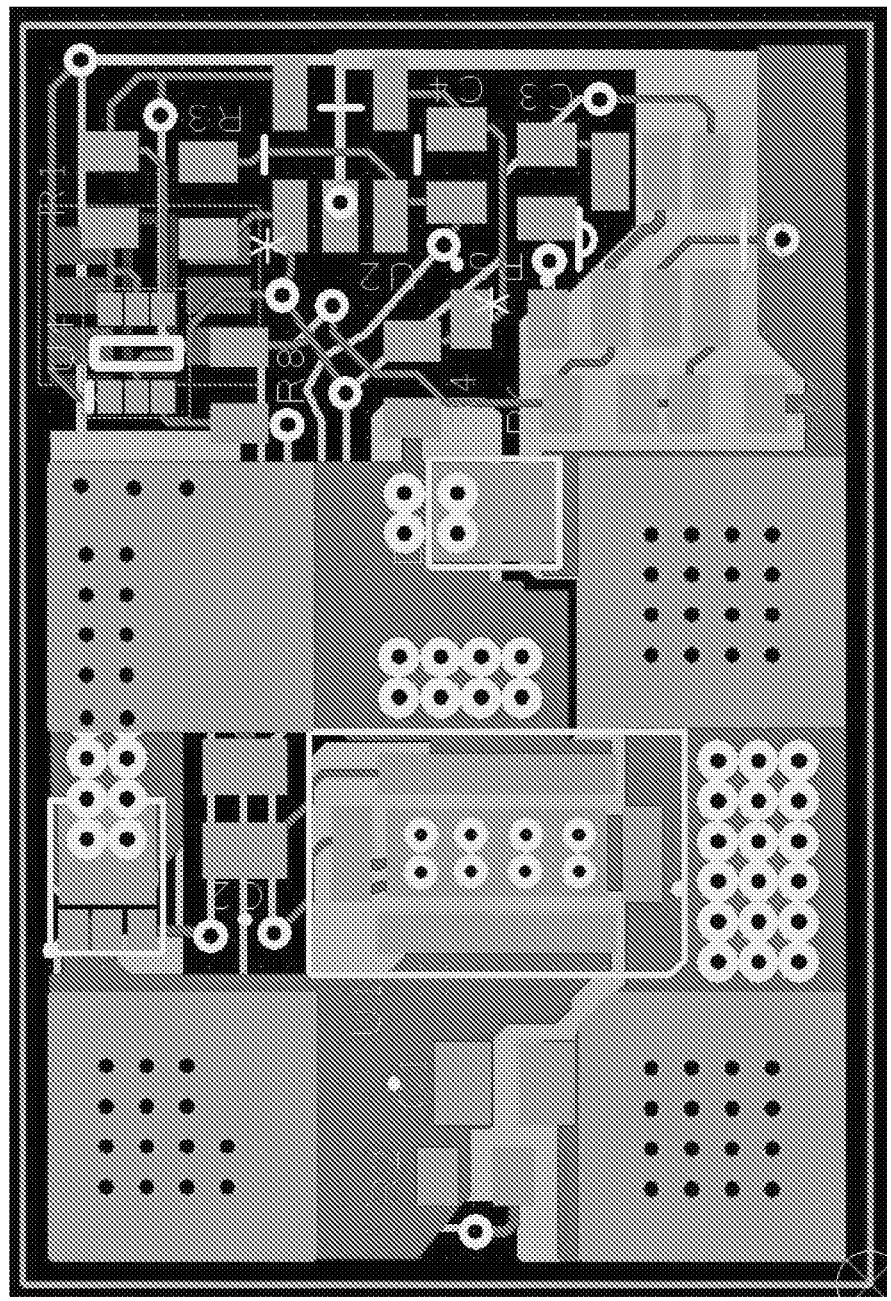
FIG. 14A shows a representative printed circuit board (PCB) design layout showing all superimposed layers for the implementation of the circuit in FIG. 12, and FIGS. 14B-D show individual layout layers of the PCB.
Figure 14B:
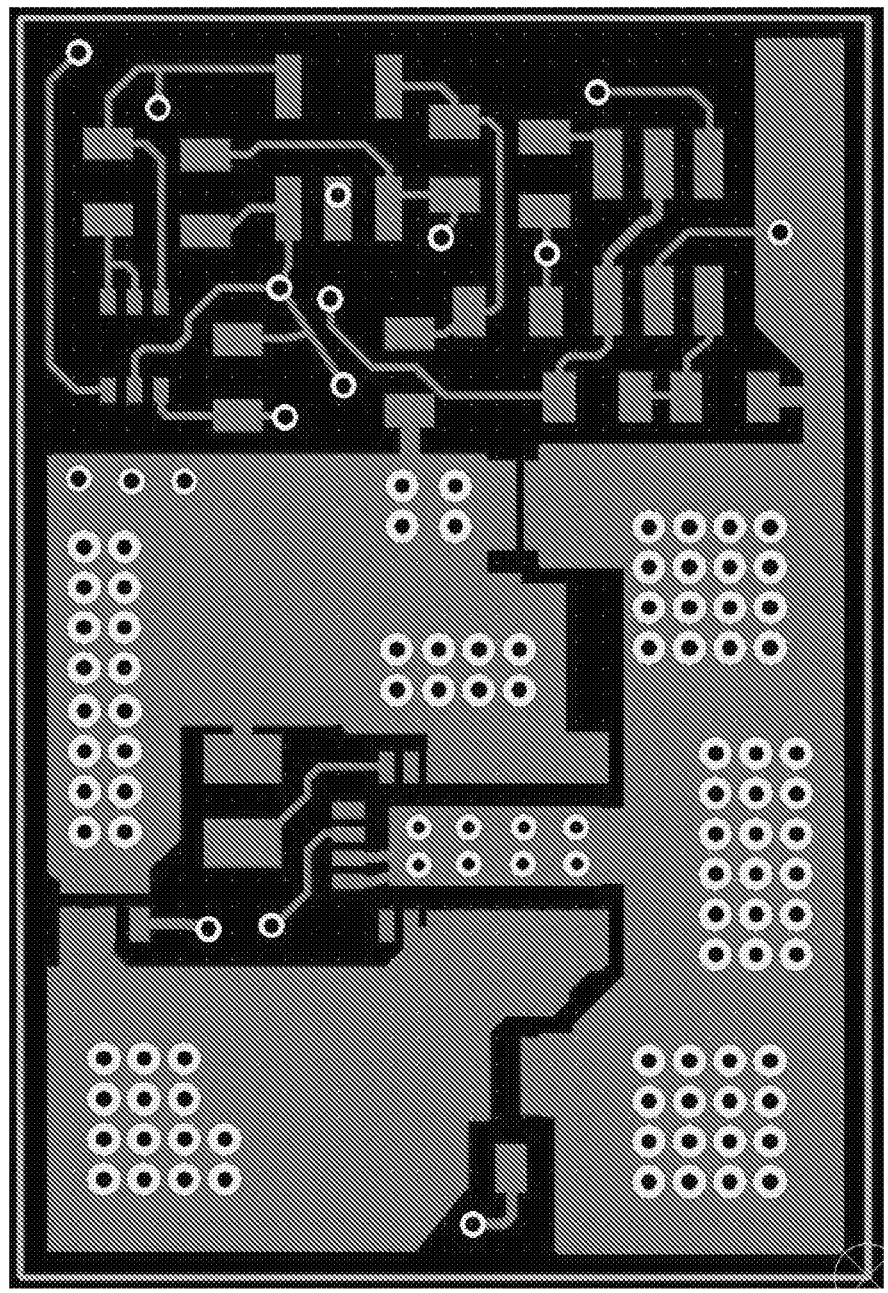
Figure 14C:
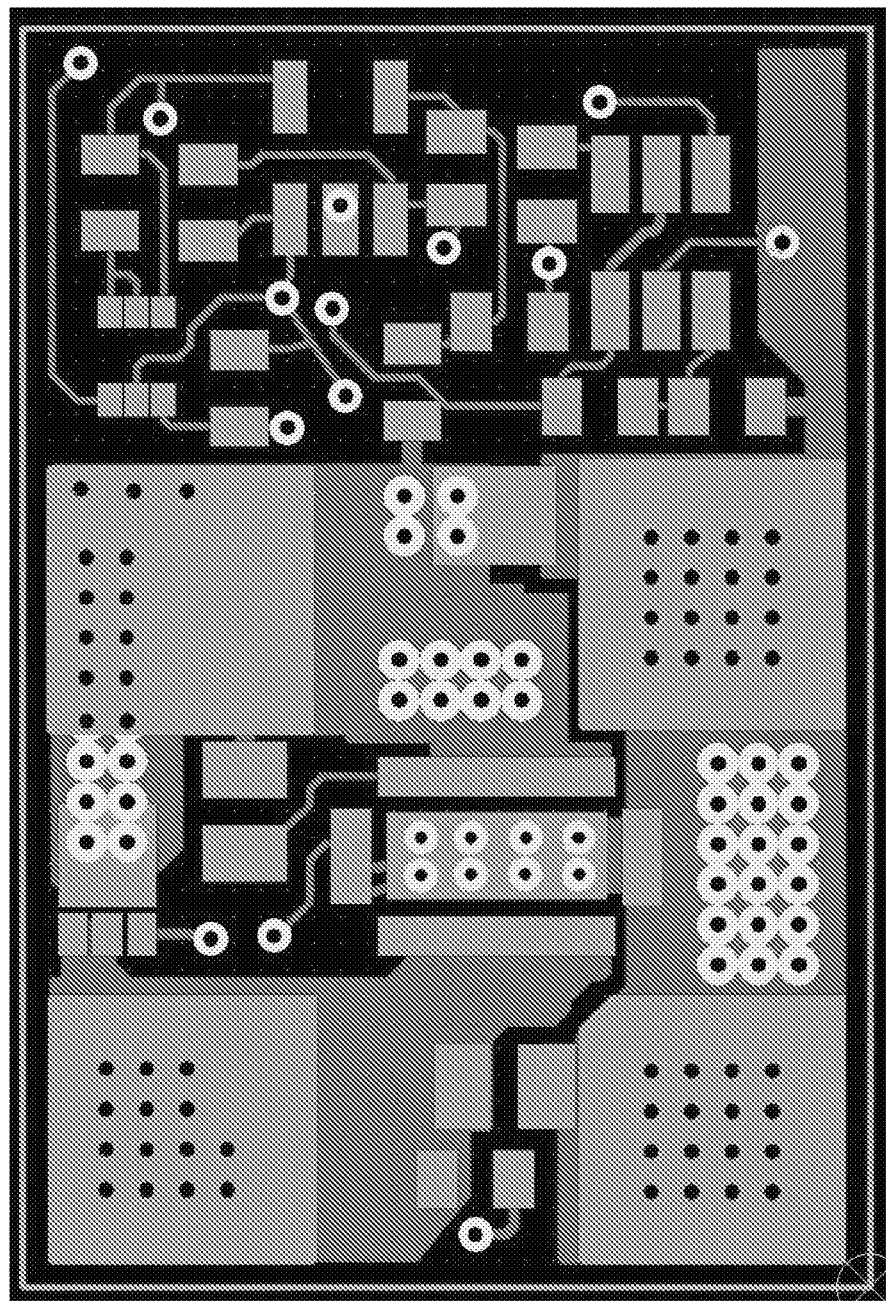
Figure 14D:
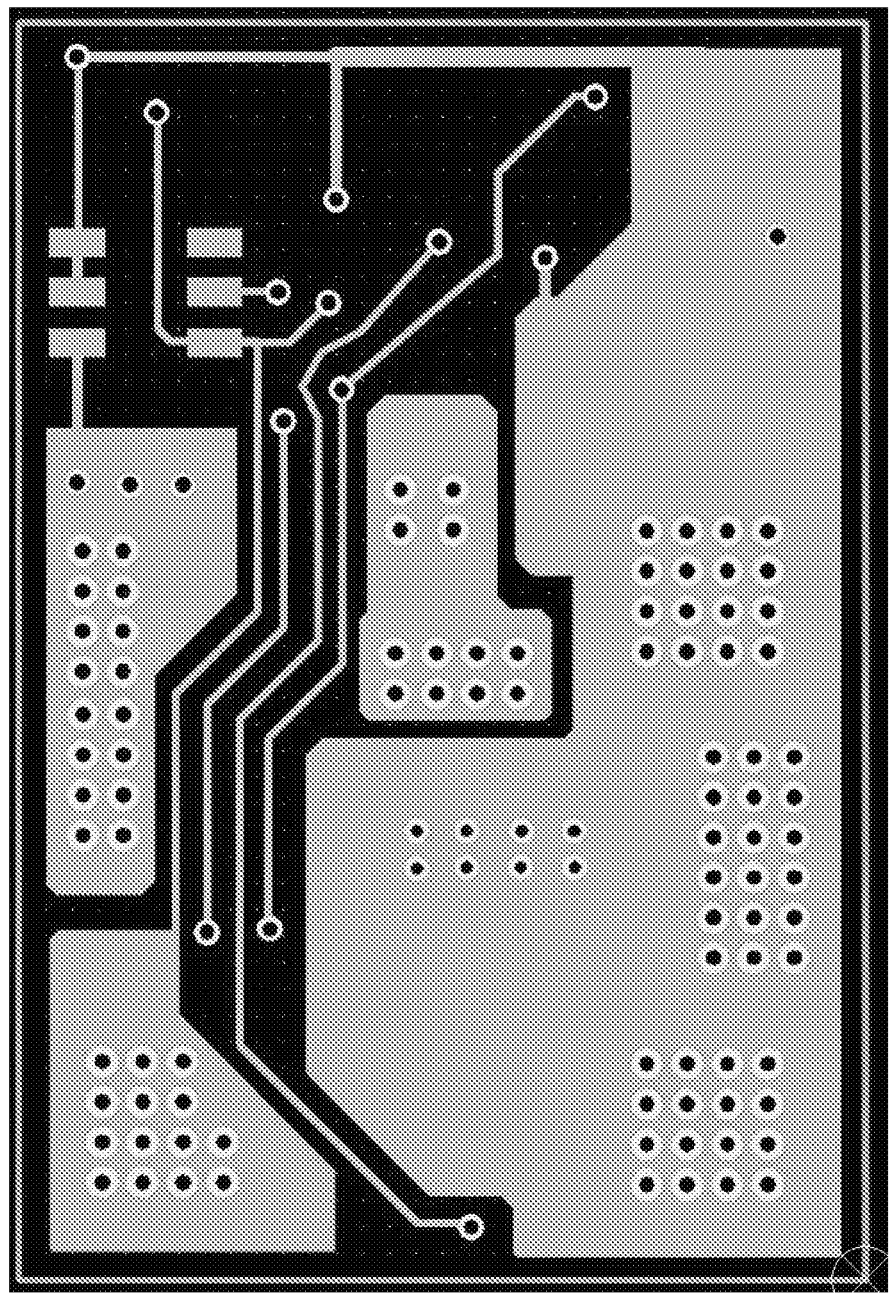
Figure 14E:
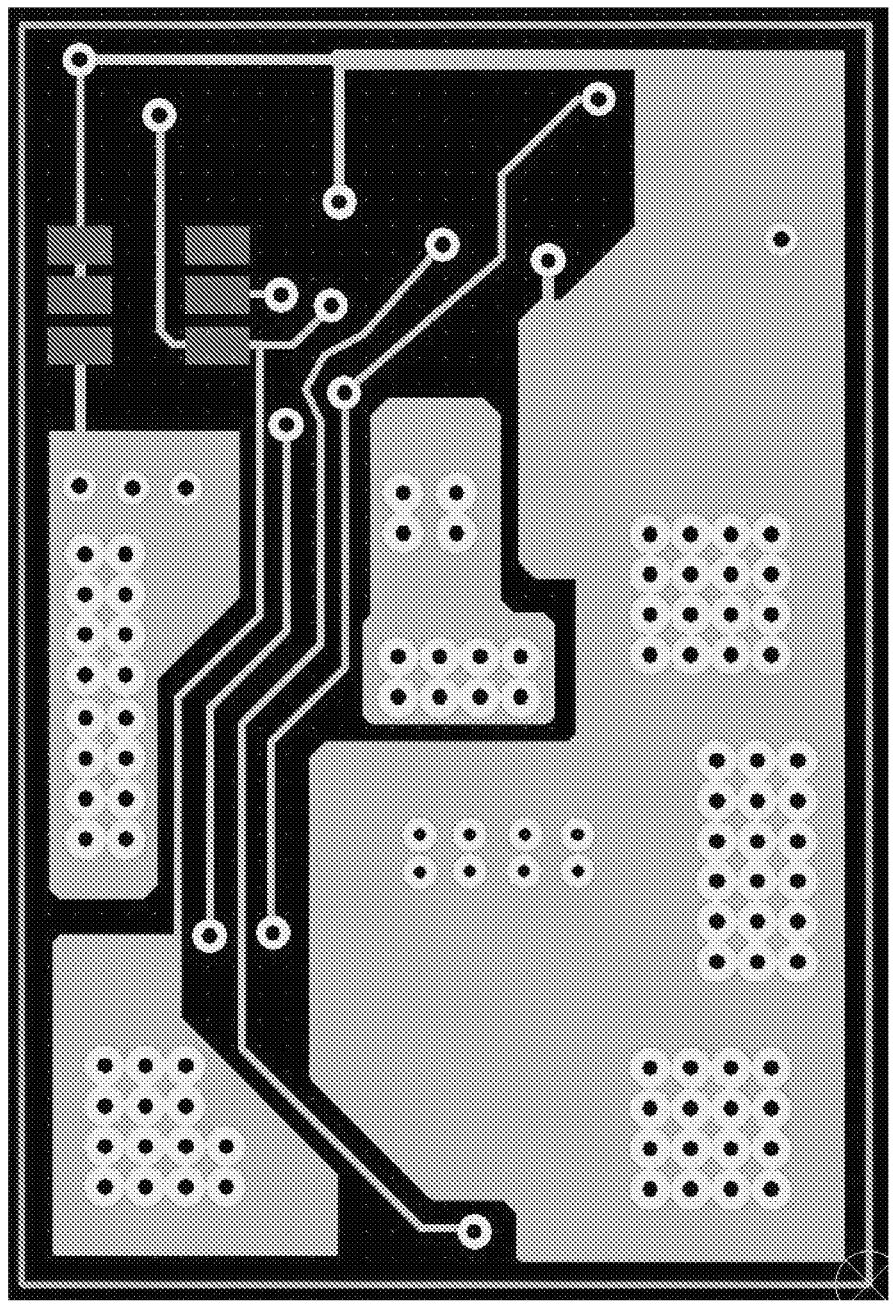

FIG. 14A shows all the superimposed layout layers of the add-on circuit shown in FIG. 12 implemented in a PCB. The PCB layout has the multi-modal MPPT IC and the add-on protection and testability circuit of this disclosure. FIG. 14B shows only the top copper layout of the PCB with no solder mask. FIG. 14C shows only the top copper layout of the PCB with the solder mask. FIG. 14D shows only the bottom copper layout of the PCB with no solder mask. FIG. 14E shows only the bottom copper layout of the PCB with the solder mask.

Figure 15:
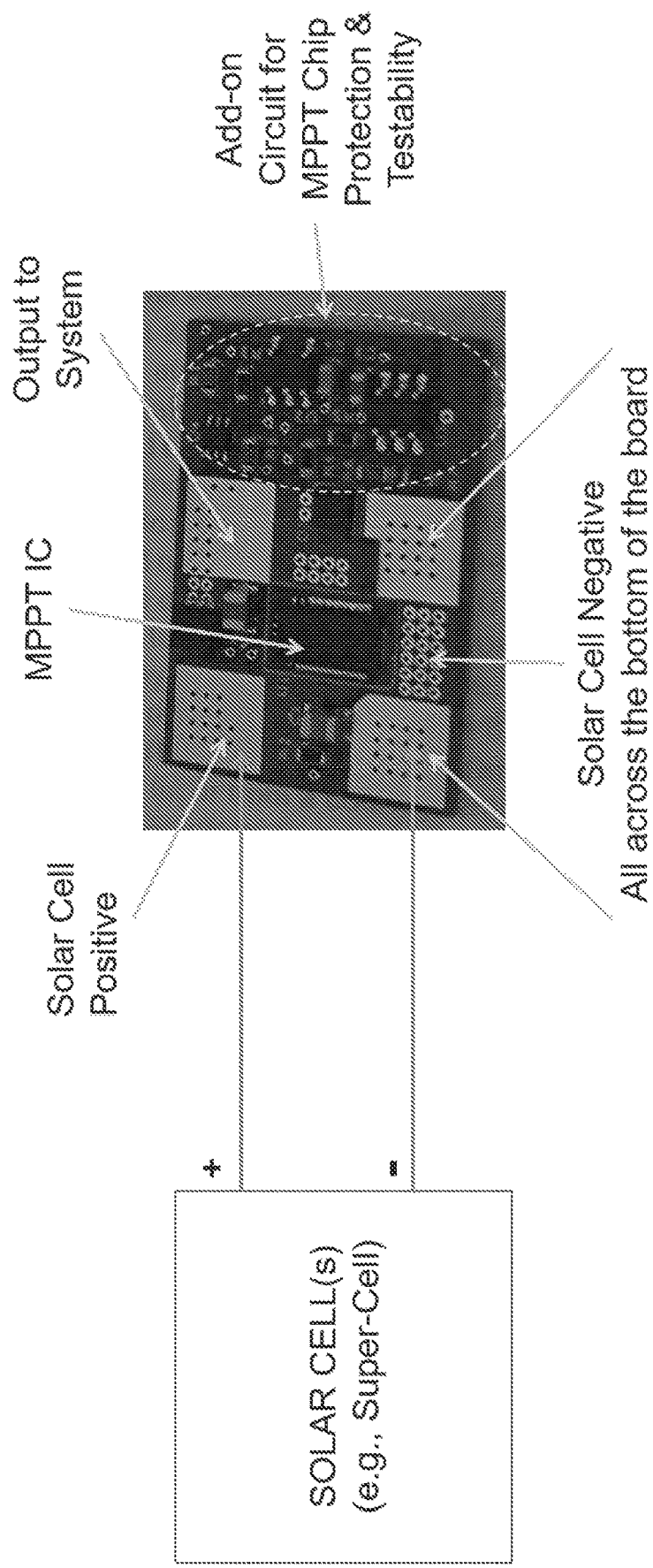
FIG. 15 shows individual connections of MPPT chip and add-on circuit PCB.

FIG. 15 shows individual connections of a multi-modal MPPT chip and add-on circuit PCB, with the add-on circuit for the MPPT chip protection and testability shown within the dashed oval outline. String of interconnected solar cells is connected to the input of the multi-modal MPPT IC via the PCB using the positive and negative leads (input pads). The solar cell may comprise a super-cell (defined as a string of interconnected partitioned solar cells or sub-cells). A super-cell structure is made of a plurality of sub-cells (which preferably have equal areas) which are formed from partitioning (for instance, laser partitioning) of full-size solar cells, such as crystalline silicon solar cells. Each super-cell may have equivalent of less than one to a plurality of equivalent full solar cells, with each full solar cell partitioned into a number of equal-area sub-cells. The plurality of equal-area sub-cells in a super-cell are electrically connected to one another either in an all-series or in a hybrid parallel-series pattern, based on the desired super-cell values for its maximum power ($P_{SC\text{-}max}$), its current scale-down factor $F_{SC\text{-}I}$ (relative to a single full-size cell), and its voltage scale-up factor $F_{SC\text{-}V}$ (relative to a single full-size solar cell).

Figure 16:
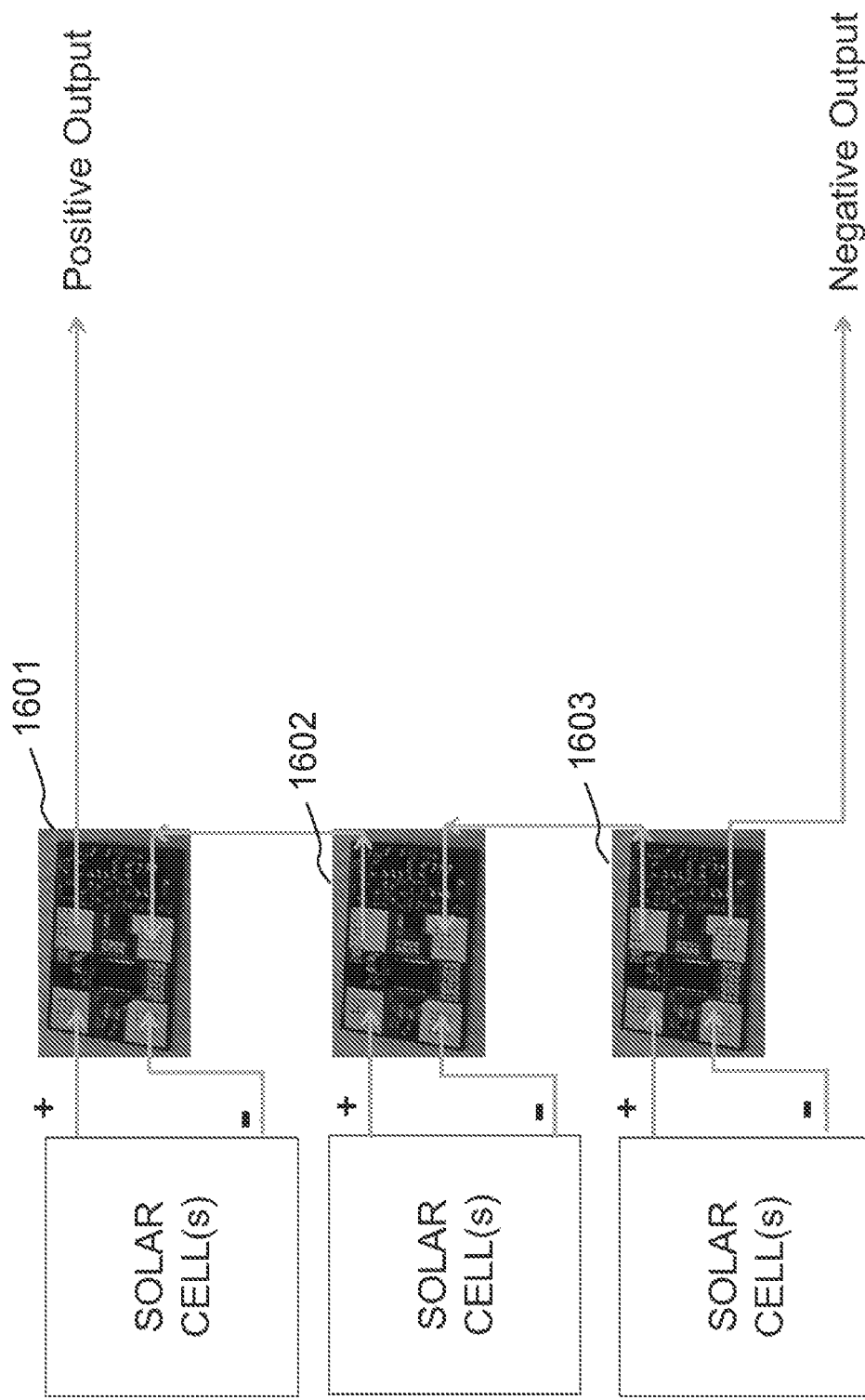
FIG. 16 shows system-level connections comprising a plurality of MPPT chips attached to groups of solar cells.

FIG. 16 shows system level connection with a plurality of super-cells, each super-cell (or string of interconnected sub-cells) having their leads going to the corresponding PCBs 1601, 1602 and 1603 (each PCB having a multi-modal MPPT integrated circuit and an add-on circuit of this disclosure). The system has a positive output lead and a negative output lead (implemented as output copper pads).

Functional Testing of Multi-Modal MPPT IC with and without the Add-On Circuit for Protection and Testability Functional testing of the combination of the multi-modal MPPT integrated circuit and add-on active bypass circuit of this disclosure was performed using representative 72-cell solar PV modules. A 6×12=72-cell multi-crystalline silicon solar PV module (having 6 full rows of 12 equivalent full solar cells per row, with each full solar cell partitioned into equal-area half cells) was configured into two similar and equal-area segments of 6×6=36-cell (or 6×12=72 half-cell) half-modules Each half-module has 6 series-connected half-rows of 6 solar cells, with each solar cell partitioned into equal-area half-cells (to reduce the cell current by a factor of 2) with all the 12 half-cells in each half-row connected in electrical series (therefore, each half-module has 6 half-rows of 12 half-cells or 6×12=72 half-cells). The output power leads (positive and negative terminals) of each half-row are electrically connected to the input power leads of one multi-modal MPPT IC chip printed-circuit board or PCB (using multi-modal MPPT IC chip PCBs either with or without the add-on protection and testability circuit of this invention), and the output power leads (positive and negative terminals) of the MPPT chip are connected in series together (i.e., 6 series-connected MPPT chips in each half-module). First, the half-rows in one half-module were connected to the MPPT PCBs having the modular add-on protection and testability circuit while the half-rows in the opposite half-module were connected to the MPPT PCBs without the add-on protection and testability circuit; the half-module having the MPPT PCBs with the add-on protection and testability circuit was tested to test functionality with flash I-V and electroluminescence (EL) testability. The other half-module having the MPPT PCBs without the add-on protection and testability circuit was tested as a reference for comparing the test results. Subsequently, the half-module having the multi-modal MPPT PCBs without the add-on protection and testability circuit of this disclosure was reworked to replace the original multi-modal MPPT PCBs (without the add-on protection and testability circuit) with the replacement multi-modal MPPT PCBs having the add-on protection and testability circuits and was retested using flash I-V and EL for additional test repeatability and functionality verification. The first half-module already having the multi-modal MPPT PCBs having the add-on protection and testability circuit was also rested as reference for further electrical test repeatability demonstration.

FIG. 17 shows a table listing the results of the flash current voltage (I-V) testing on half-module sections. Flash I-V test parameters: Isc to Voc sweep, 100 ms sweep duration.

In the Table, Old vs New MPPT PCBs indicates the multi-modal MPPT PCBs without and with the add-on protection and testability circuit, respectively. Based on the experimental test results, new multi-modal MPPT boards or PCBs (the multi-modal MPPT PCBs having the add-on protection and testability circuit) enable reliable and repeatable flash I-V measurements of the PV module—very close to theoretically expected short-circuit current (Isc), open-circuit voltage (Voc), and maximum-power (Pmp) values unlike the multi-modal MPPT PCBs without the add-on circuit for protection and testability. A measured Pmp difference of about 10% is observed on Half-Module A having the multi-modal MPPT PCBs without the add-on circuit for protection and testability compared to the Half-Module using the multi-modal MPPT PCBs having the add-on circuit. Realistic and correct measured Isc and Voc values are also measured when using the multi-modal MPPT PCBs having the add-on circuit for protection and testability on the PV module.

Figure 18:
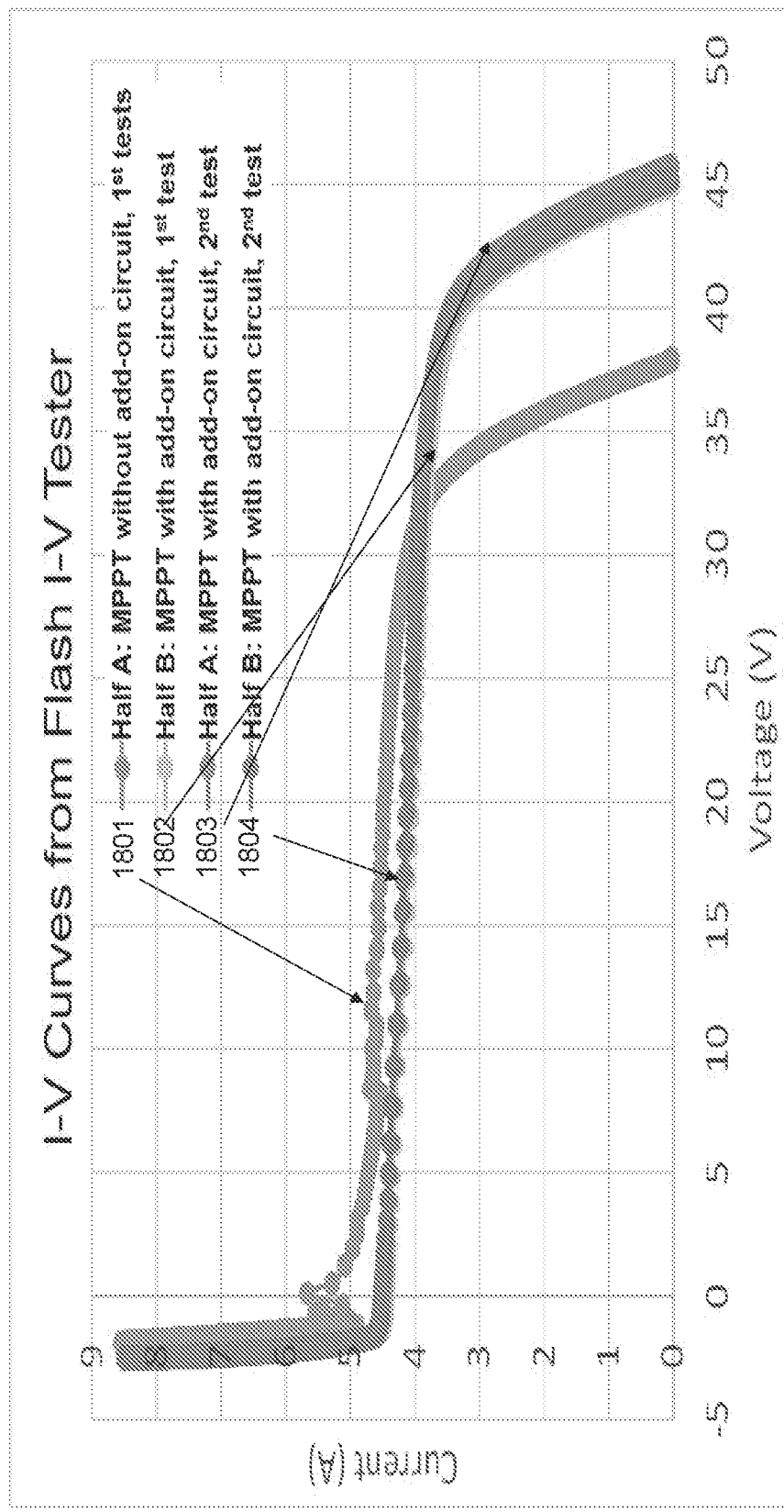
FIG. 18 shows the results of the flash I-V test in graphical form on solar PV module sections with the MPPT chips, with and without the add-on circuits of this disclosure.

FIG. 18 shows flash I-V test curves on half-module using two types of multi-modal MPPT PCBs. The 72-cell module has two half-modules: Half-Module A (Half A) and Half-Module B (Half B), with each half-module having 6 rows of twelve series-connected half-cells, and each of the six rows in each half-module connected to one multi-modal MPPT PCB. The multi-modal MPPT PCBs with the add-on circuit for protection and testability enables full-range normal flash I-V (current-voltage) sweep measurement of the PV module (unlike the multi-modal MPPT PCBs without the add-on circuit for protection and testability). Note the change in the flash I-V curve (from abnormal to normal flash I-V test curve) on Half-Module A when the multi-modal MPPT PCBs are changed from those without the add-on circuit to those having the add-on circuit for protection and testability of this disclosure. Specifically, curve 1801 is the Half A MPPT without add-on circuit. Curve 1802 is the Half B MPPT with add-on circuit (1st test). Curve 1803 is the Half A MPPT with add-on circuit ($2^{nd}$ test). Curve 1804 is the Half B MPPT with add-on circuit (2nd test). The multi-modal MPPT PCBs with the add-on circuit for protection and testability enable normal flash I-V testing and EL testing of the PV modules using distributed MPPT.

In summary, the multi-modal MPPT PCBs having the add-on circuit for reverse-current protection and testability of this invention fully enable reliable and repeatable flash I-V and electroluminescence (EL) testing of solar PV modules having such MPPT PCBs. Since the EL testing involves flowing a current through the solar module in the opposite direction of the photogeneration current, the multi-modal MPPT PCBs having the add-on circuit for reverse-current protection and testability of this invention protects the multi-modal MPPT chip from failure by actively bypassing the multi-modal MPPT chip to protect it during the reverse-current-flow EL testing. For enabling normal flash I-V testing of PV modules having distributed multi-modal MPPT power optimization chips in them, the multi-modal MPPT PCBs having the add-on circuit for reverse-current protection and testability of this invention effectively disable the power optimization function of the MPPT chips during the flash I-V testing period. The multi-modal MPPT PCBs having the add-on circuit for reverse-current protection and testability of this invention fully enable broad applications of the multi-modal MPPT chips for distributed power optimization to maximize solar electric power generation in various solar PV modules and systems, while enabling full protection against reverse current flow failures (e.g., during EL testing), and complete testability for accurate flash I-V and EL testing of PV modules.

Figure 19:
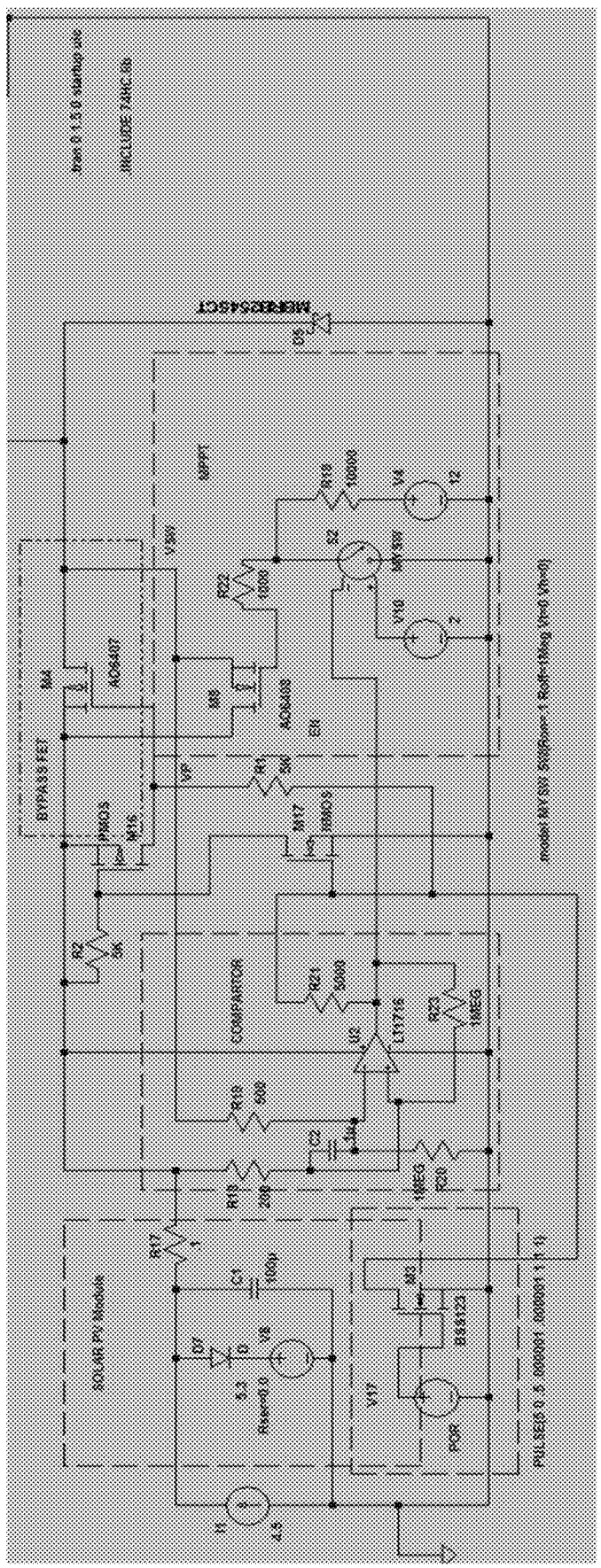
FIG. 19 shows schematic diagram of the circuit for simulating and testing add-on protection (and for enabling EL testing of PV module) and flash I-V testability circuit.

Simulations and Testing of the Add-On Protection and Testability Circuit Used with the Multi Modal MPPT IC FIG. 19 shows the simulation of schematic circuit diagram, which includes the multi-modal MPPT IC, the driver, the comparator, the bypass FET, the solar PV module, and the POR circuit shown in the schematic of FIG. 12. As shown in FIG. 10, a dual FET (6-pin package) and two resistors are added in the circuit, because drive strength of the comparator is not sufficient to keep FET off when the multi-modal MPPT IC is running.

Figure 20:
FIG. 20 shows some experimental results of driver test.

FIG. 20 shows results of the driver test. The top curve 2001 is the gate voltage, the middle curve 2002 is the voltage $V_{SW}$ as shown in FIG. 10, and the bottom curve 2003 is the voltage $V_P$, as shown in FIG. 10. FIG. 20 shows that the gate is not triggering during $V_{SW}$ switching.

Figure 21:
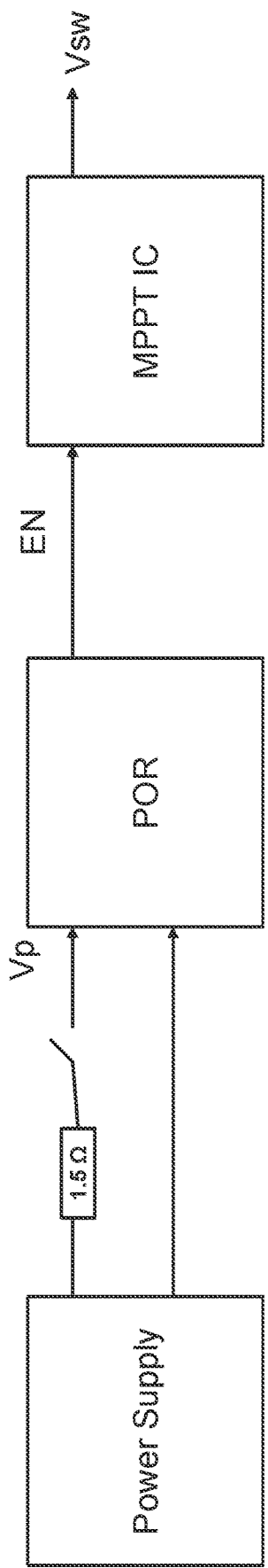
FIG. 21 shows a schematic diagram of the POR test circuit.

FIG. 21 shows the power-on-reset (POR) test circuit, connected with the power supply through a 1.5 Ohm resistor and a switch.

Figure 22:
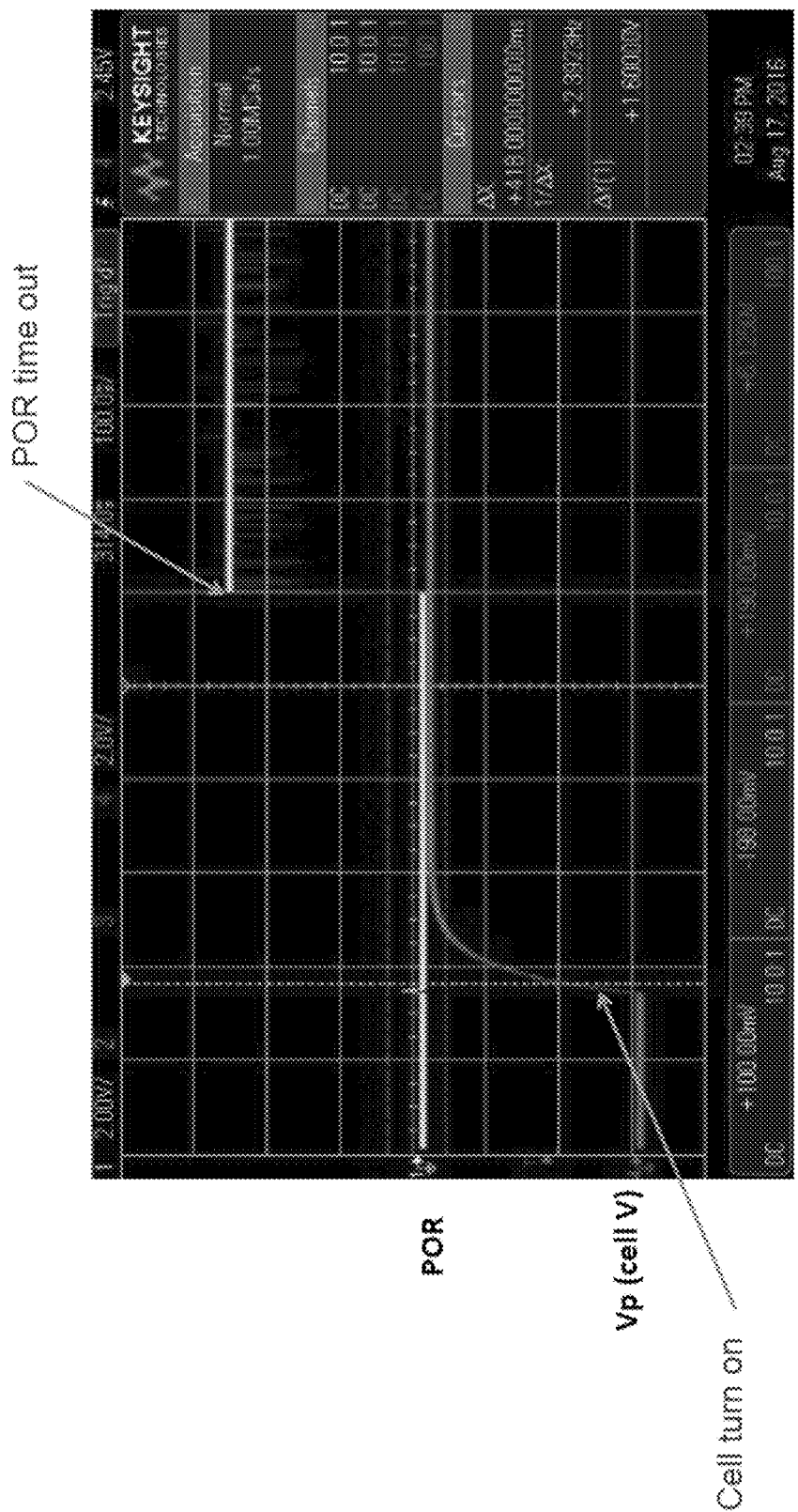
FIG. 22 shows experimental results from MPPT, bypass FET switch, and POR circuits connected together.

FIG. 22 shows results of the POR test. The POR may use a MX16052 chip, though other commercially available chips may be used. The chip uses 0.1 µF capacitor with 418 ms (or 0.418 second) delay, where multi-modal MPPT, Bypass and POR circuits are connected together. The POR curve (the top curve) POR time out, and the $V_P$ (cell voltage) curve show cell turn on.

Figures 23A, 23B:
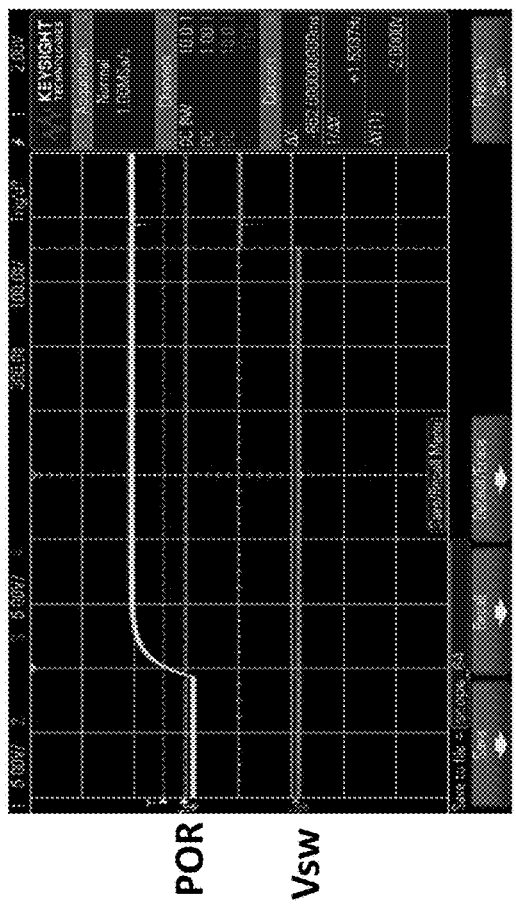
FIG. 23A-B show results of electrical tests on POR circuit.

FIG. 23A shows the POR timing results in a tabular form. FIG. 23B shows the POR (top curve) and $V_{SW}$ (bottom curve) plotted against time.

Figure 24:
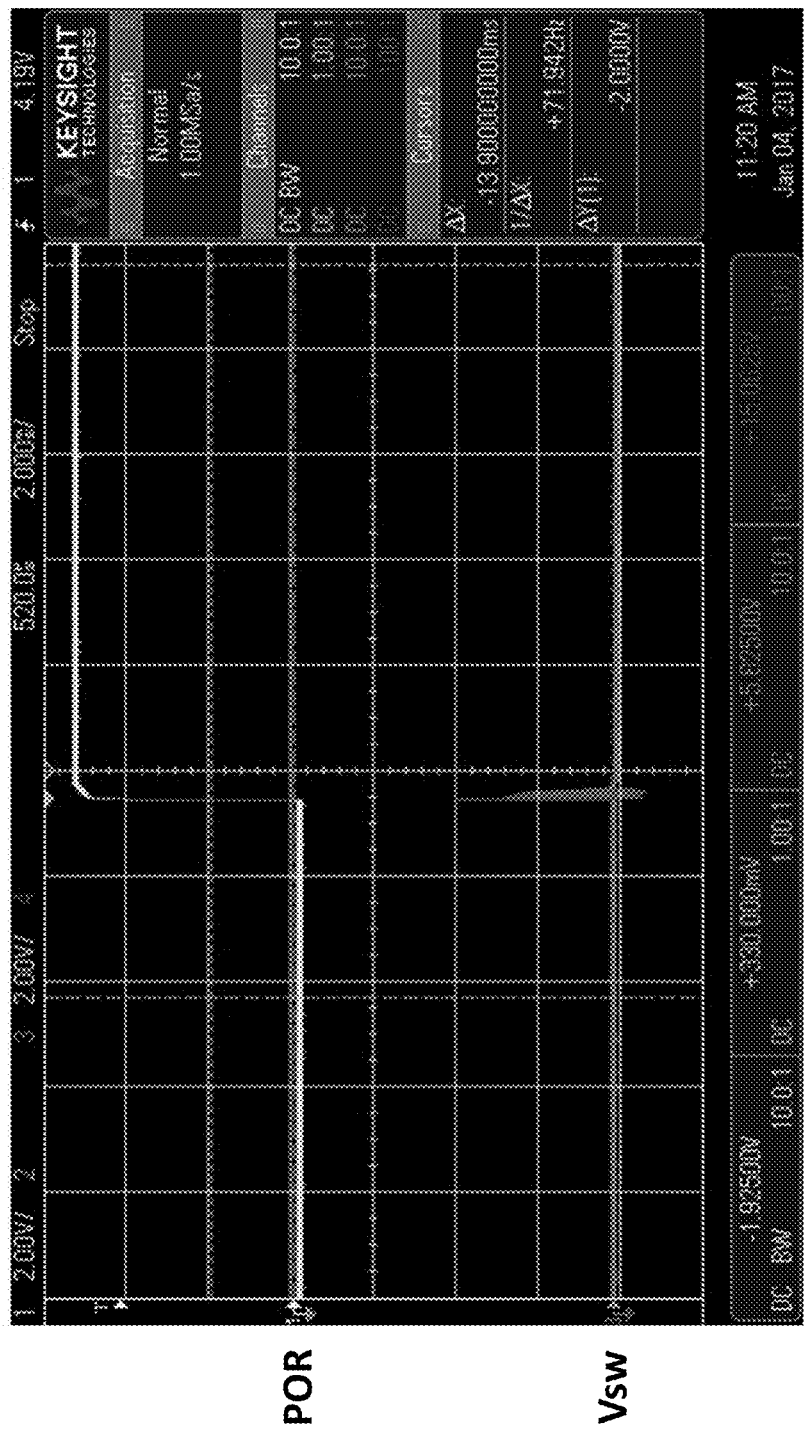
FIG. 24 shows experimental results plotting POR pulse and MPPT chip voltage output.

FIG. 24 shows results of production test, showing POR curve (top) and $V_{SW}$ (bottom) plotted against time.

Figure 25:
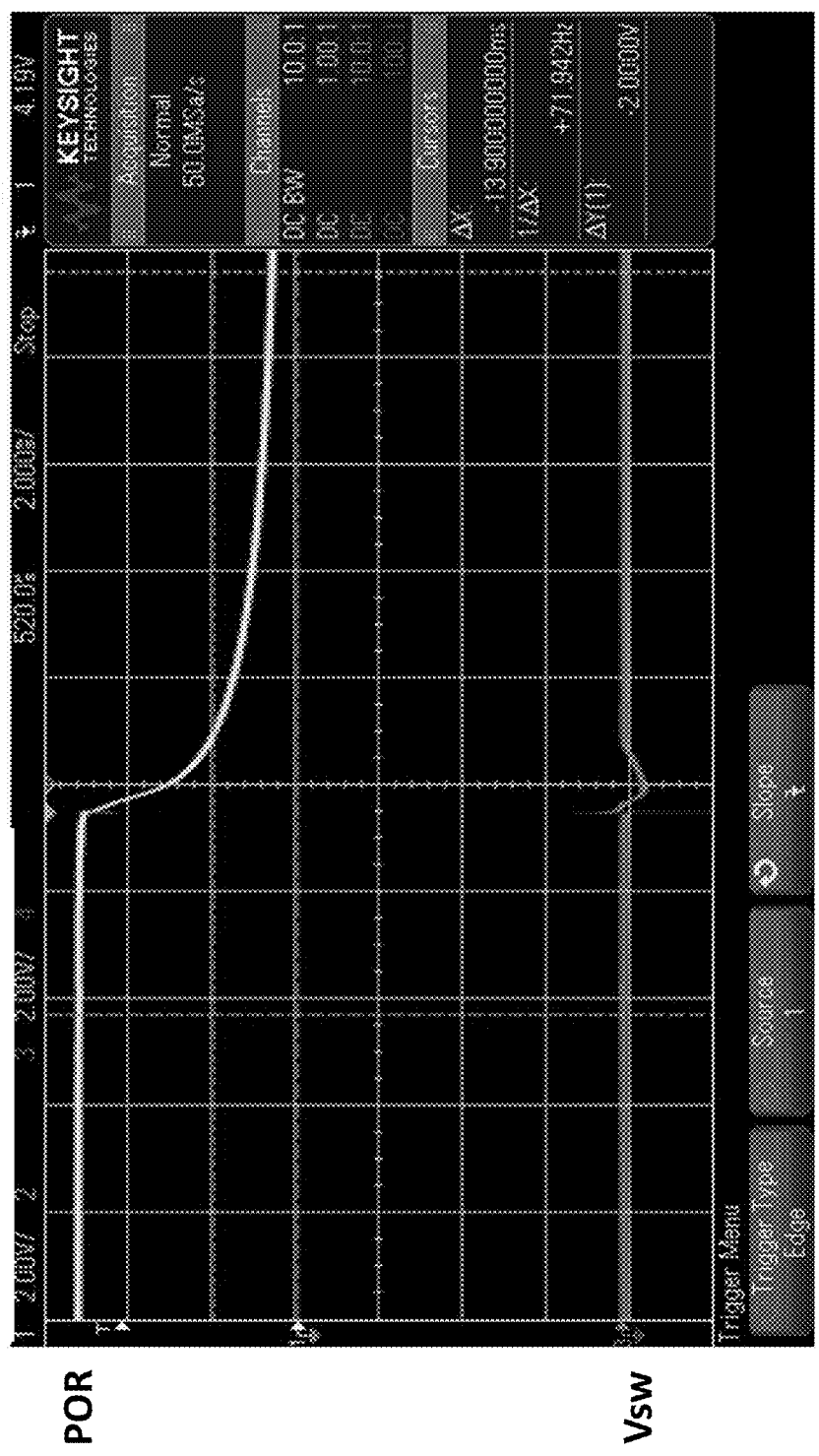
FIG. 25 shows experimental result from production test with solar cell shot down.

FIG. 25 shows results of production test when solar cell is shut down. POR curve (top) and $V_{SW}$ curve (bottom) are plotted against time.

Figure 26:
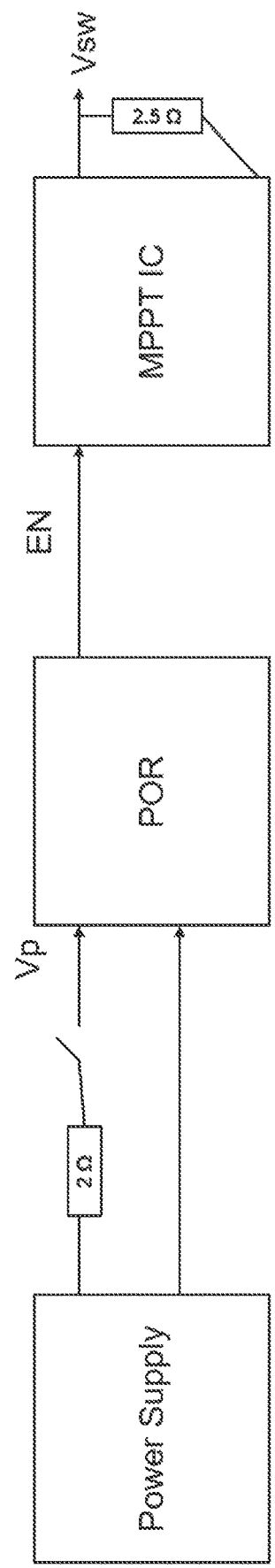
FIG. 26 shows regulation test circuit with the POR circuit connected to the MPPT chip.

FIG. 26 shows a test circuit for cell voltage ($V_{cell}$) regulation where the power-on-reset (POR) test circuit is connected with the power supply through a 2 Ohm resistor and a switch, and a 2.5 Ohm resistor is connected in parallel with the MPPT IC.

Figure 27:
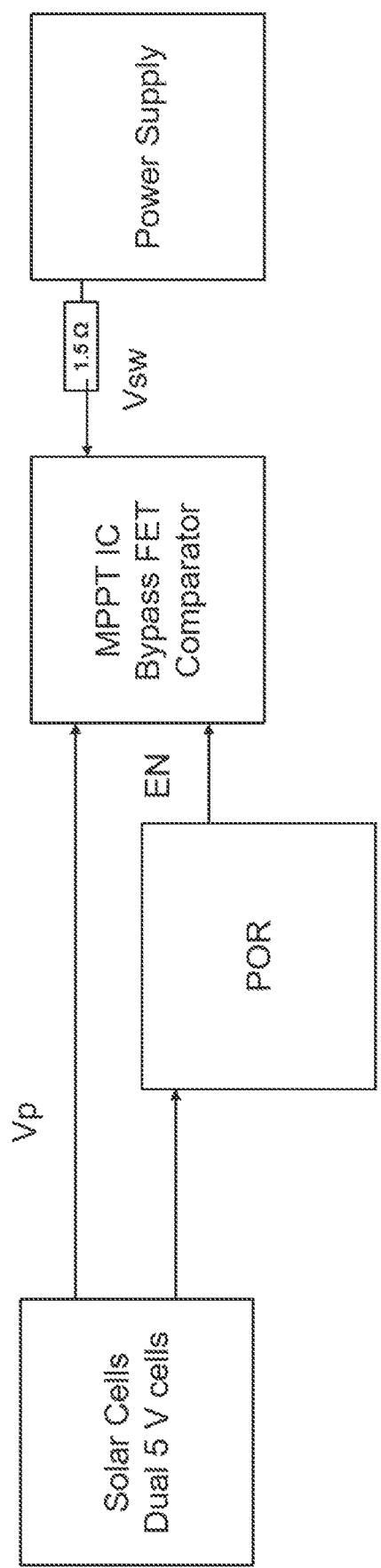
FIG. 27 shows reverse current protection test circuit connected to the MPPT chip, using solar cells and power supply.

FIG. 27 shows a test circuit for reverse current protection using solar cells and a load. The reverse current protection worked every time the test was conducted, i.e. every time it passed the Pass/Fail test.

Figure 28:
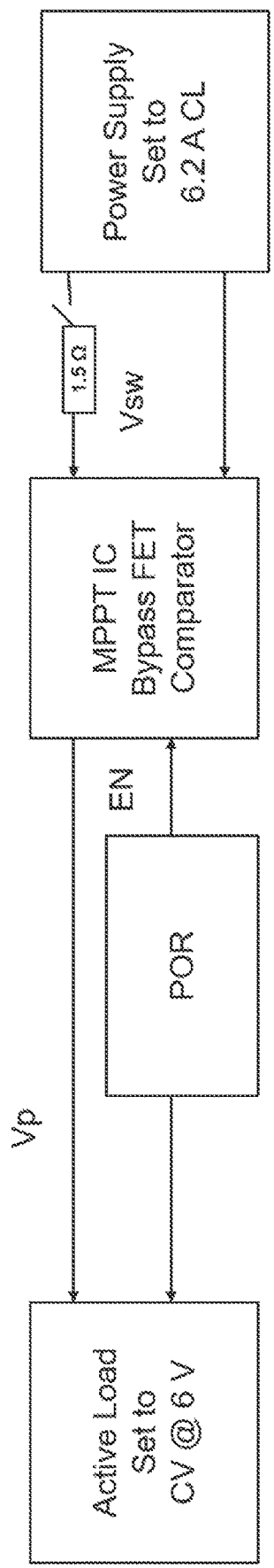
FIG. 28 shows reverse current test set up using an active load set to a constant voltage.

FIG. 28 shows another test circuit for the reverse current test using an active load set to a constant voltage. In this test circuit, 6.2 A current flows into the bypass FET.

Figure 29:
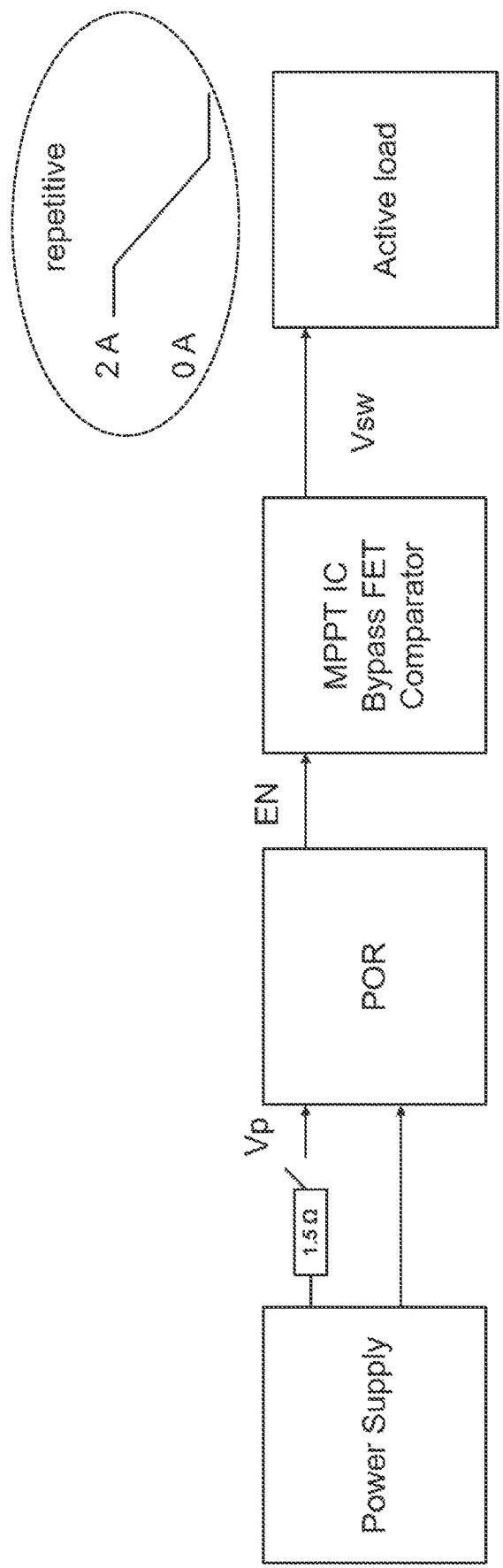
FIG. 29 shows test circuit for flash current-voltage (I-V) testability of PV module having multi-modal MPPT chip.

FIG. 29 shows circuit for flash current-voltage (I-V) testability, where an active load is fed with repetitive current pattern (varying between 2 A and 0 A) as shown within the dashed oval. Simulated flash I-V production test was successful every time the test was conducted.

Specification of Multi-Modal MPPT IC Chip Capable of Operating with the Modular Add-On Protection and Testability Circuit The multi-modal MPPT IC was designed as a 2.5 A solar cell string power optimizer capable of regulating the output voltage of a solar cell string to its optimum power (in practice, the current rating of the multi-modal MPPT IC was verified to be higher than the design specification and around 4 A). It does that by regulating the input voltage to a predetermined voltage. This optimum voltage is derived by measuring the open circuit voltage ($V_{OC}$) and then regulating the cell voltage to about 76% of $V_{OC}$ (for high-efficiency crystalline silicon solar cells, this percentage may be set to be in the range of about 75% to 84%).

Figure 30:
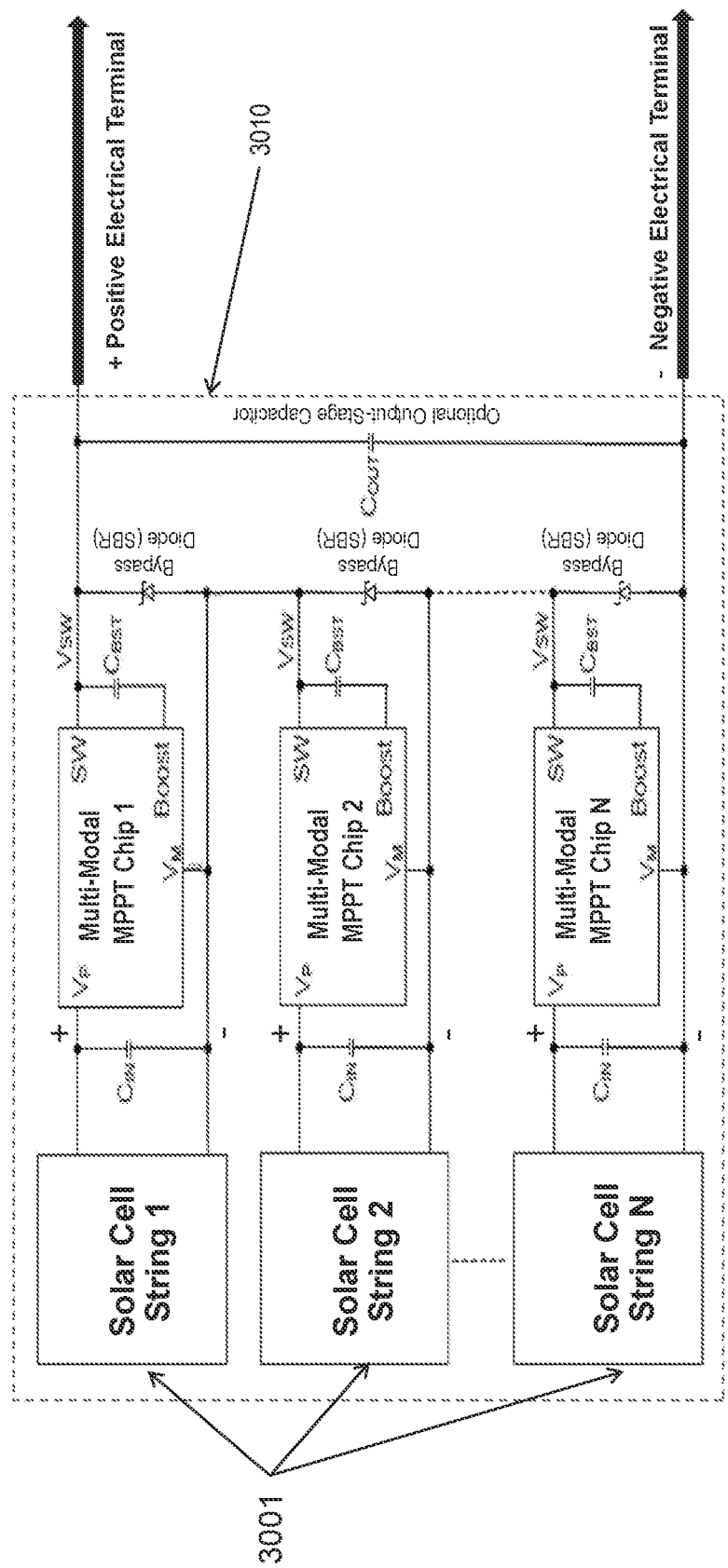
FIG. 30 shows a representative application circuit having the distributed multi-modal MPPT IC chips capable of operating with the add-on circuit of this disclosure.

FIG. 30 shows a representative application circuit having the multi-modal MPPT IC chip capable of operating with the add-on circuit of this disclosure. In FIG. 30, Schottky Barrier Rectifier (SBR) bypass diodes are shown for each multi-modal MPPT chip (attached to the output leads to provide photo-generated current pass-through pathway in case a multi-modal MPPT IC fails for any reason). Also shown are boost capacitors $C_{BST}$ and input capacitors $C_{IN}$ for each MPPT chip. Typical value of $C_{IN}$ is greater than or equal to 4.7 µF. Typical value of $C_{BST}$ is greater than or equal to 4.7 µF. The example in FIG. 30 shows multiple multi-modal MPPT IC chips in a building block unit 3010 within the dashed enclosure, with positive and negative electrical terminals extending out. Note that a load (not shown) can be connected between the positive and negative terminals. Each multi-modal MPPT chip is connected to a plurality (e.g., 10 to 16) of partitioned solar sub-cells (forming a super-cell string). A plurality of partitioned sub-cells are arranged into a plurality of solar cell strings 3001 (which may be referred to as super-cells in a modularized power generator) in the building block 3010. The example here is shown with multiple series-connected multi-modal MPPT chips (one multi-modal MPPT chip for each solar cell string/super-cell).

Figure 31:
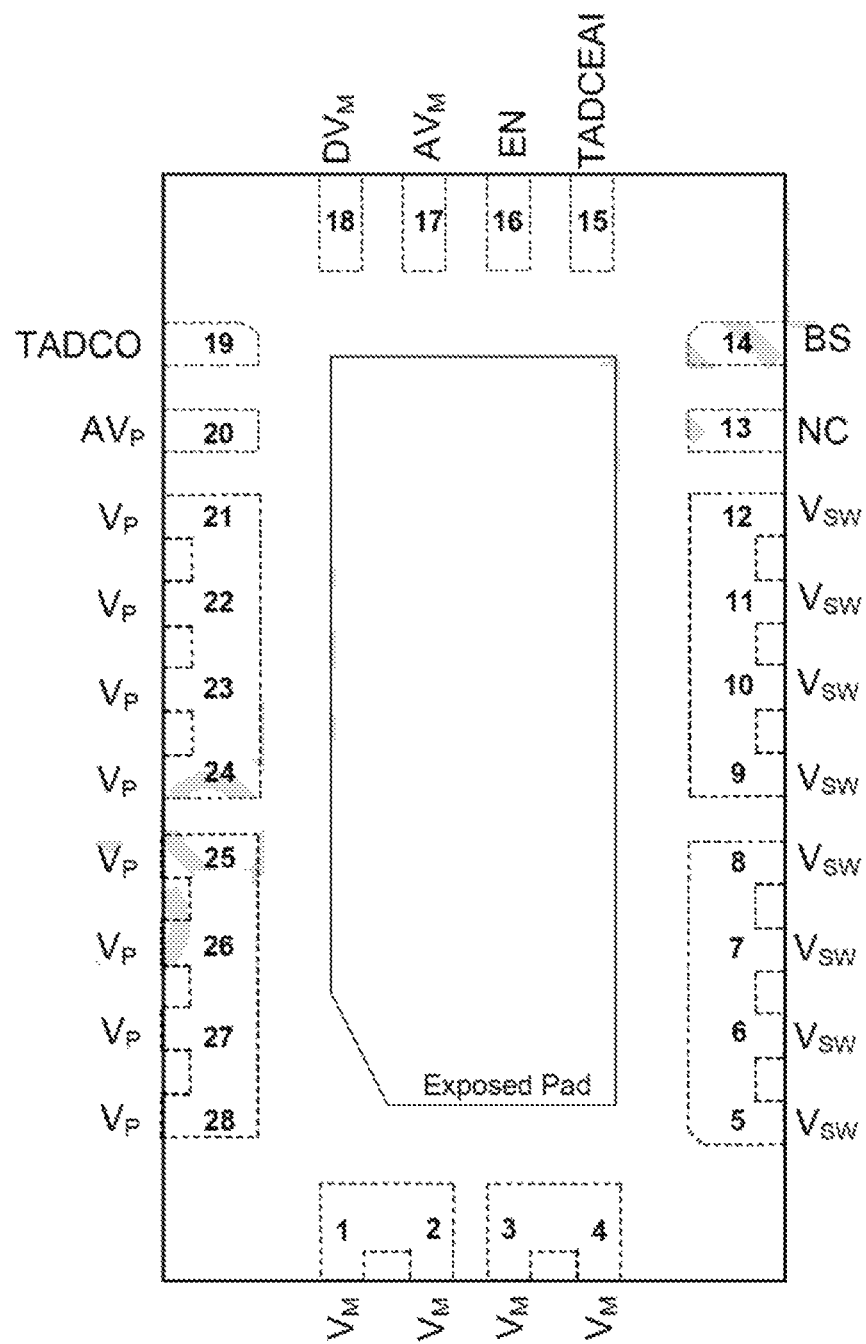
FIG. 31 shows the top view of an example multi-modal MPPT IC chip package pin assignment, for a multi-modal MPPT chip having an ENABLE (EN) pin for operation with the add-on circuit of this disclosure.

The optimizer is designed to operate over the normal power supply voltage range of 4.5 V to 10.5 V (which is the voltage of each solar cell string) and has been designed to provide an effective overall operating efficiency of about 99.5% typical in pass-through mode (discussed below). The multi-modal MPPT chip utilizes an Analog-to-Digital Converter (ADC) based architecture for sample and hold to minimize power consumption and to support long sample and hold times. To maximize power harvest and minimize losses, the device has multiple operating modes (hence, multi-modal MPPT). To minimize space and height, the multi-modal MPPT IC has been designed to be available in low-profile (i.e., very thin and on the order of 0.60 mm) package, such as Quad Flat No-Lead (QFN) package (e.g., QFN3055-28), shown in FIG. 31 with the pin assignments (top view).

FIG. 32 illustrates pin descriptions of the multi-modal MPPT IC chip of FIG. 30 capable of operating with the add-on circuit of this disclosure. Note that NC indicates "no connection" pin and is not connected internally. This pin can be left open. The "Exposed pad" is for thermal heat sinking purpose and is also electrically connected to $V_M$.

Figure 33:
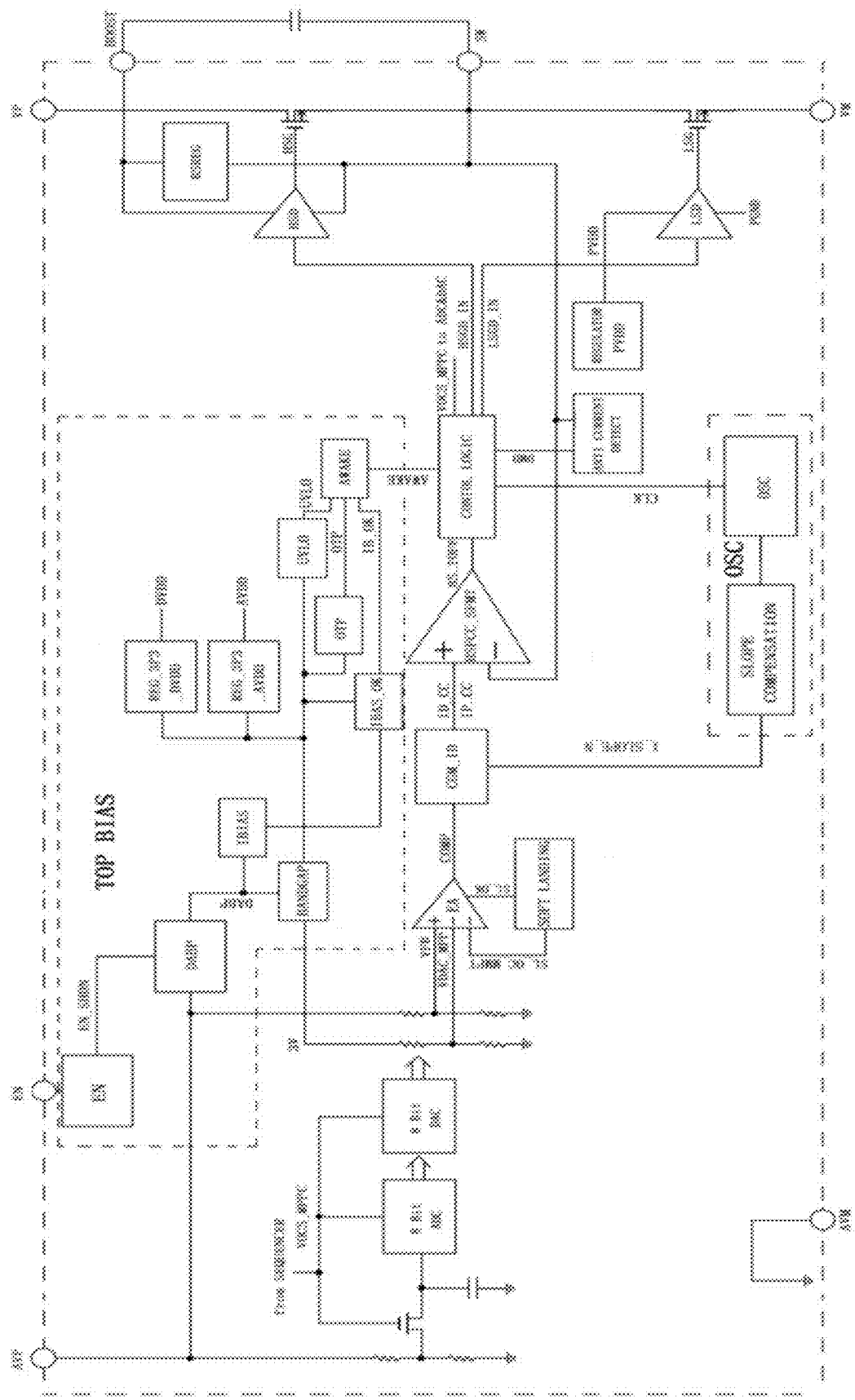
FIG. 33 shows the functional block diagram of the multi-modal MPPT IC chip capable of operating with the add-on circuit of this disclosure.

FIG. 33 shows the functional block diagram of the multi-modal MPPT IC chip design capable of operating with the add-on circuit of this disclosure.

FIGS. 34A and 34B show respectively maximum ratings and recommended operating conditions of the multi-modal MPPT IC chip capable of operating with the add-on circuit of this disclosure. Note that stresses greater than the "absolute maximum ratings' specified may cause damage to the device. Functional operation of the device at these stress ratings or other conditions exceeding those listed in this specification and drawings is not implied. Device reliability may be affected by exposure to absolute maximum rating conditions for extended periods of time. The absolute maximum ($V_P$-$V_M$) of 11V is a transient stress rating and is not meant as a functional operating condition. It is not recommended to operate the device at the absolute maximum rated conditions for any extended period of time.

FIG. 35 shows electrical characteristics of the multi-modal MPPT IC chip capable of operating with the add-on circuit of this disclosure.

Figures 36A, 36C:
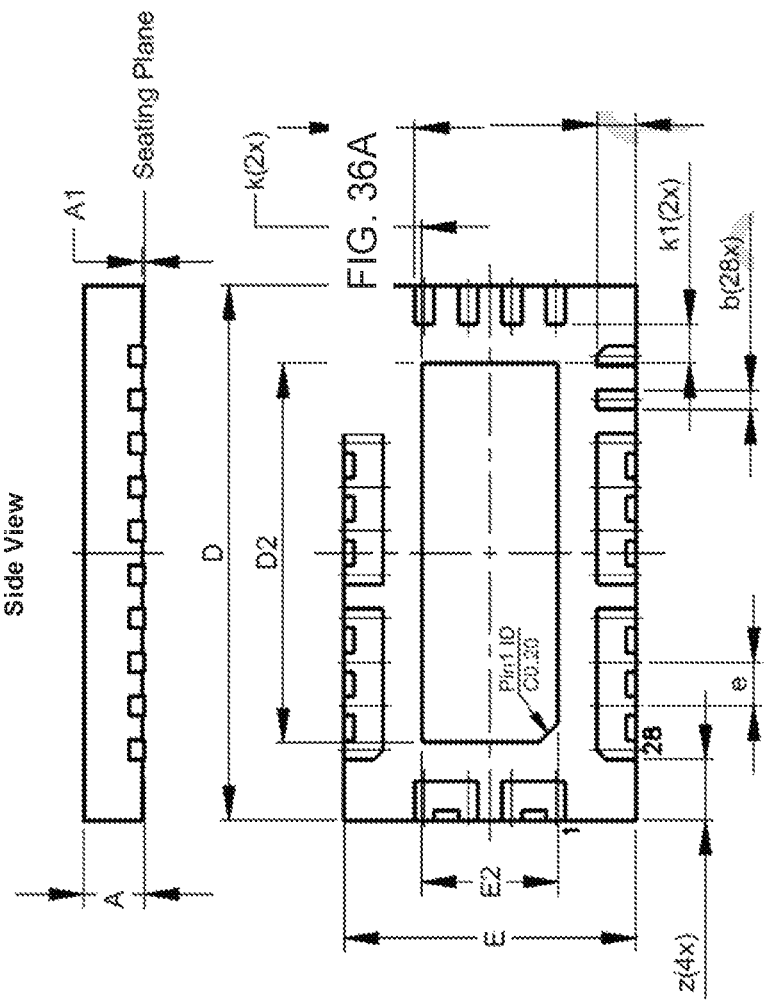

FIGS. 36A and 36B respectively show side view and bottom view of multi-modal MPPT IC chip with the dimensions in the table in FIG. 36C.

Operation of Multi-Modal MPPT IC Chip Capable of Operating with the Add-On Protection and Testability Circuit The power maximizing chips work together with an AC inverter or a DC converter. A panel (or string) of solar cells is usually connected in series, comprising 10-20 (or more) cells. The AC inverter or DC converter connects to the string of cells and converts the DC panel voltage to an AC or DC voltage and sources power to the grid or a DC load. The AC inverter or DC converter also typically provides MPPT functions. The inverter loads the panel until the peak power is reached. See FIG. 37.

Figure 37:
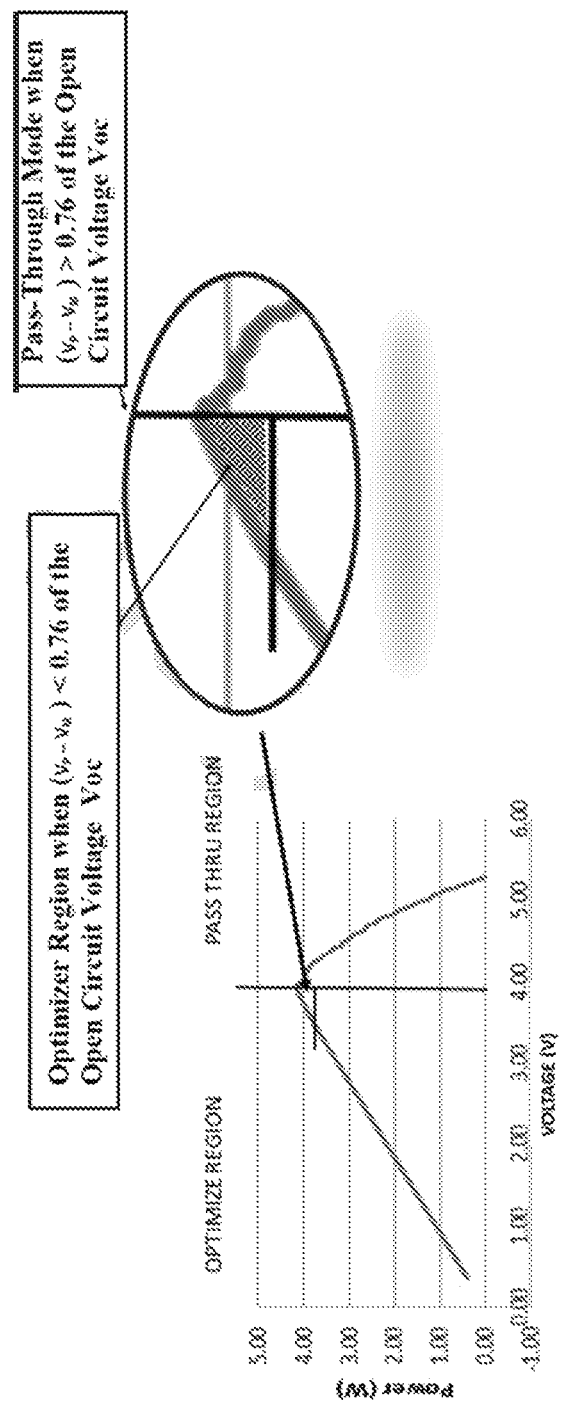

The multi-mode MPPT IC chips described here must "pass" the cell string's electrical energy to the PV module string for the inverter or converter to see this maximum power point. This is the pass-through region or mode. If all cell strings are operating normally (and approximately equally), the multi-modal MPPT IC optimizer will stay in pass-through mode. The PV module operates best when all cell strings deliver the same current. If for some reason a cell string cannot support the required current, its output voltage will drop. If permitted to drop too low, the cell string and PV module will not operate at peak power. With the multi-mode MPPT IC optimizer on the cell string, open-circuit voltage of the cell string is measured. A predefined percentage (e.g. approximately 76% for crystalline silicon solar cells) of the open-circuit voltage is used as the MPPT point of the cell string. If the voltage of a loaded cell string reaches this point, it starts to regulate the input voltage of the cell string to the MPPT point. Thus, the multi-modal MPPT IC operates in the switching "optimizer" region, as shown in FIG. 37.

The multi-modal MPPT IC chip provides multiple modes of operation.

Pass-through mode of operation: When the PV cell string voltage ($V_P$-$V_M$) is in the range of 5V-10.5V (rising) and 4.5V-10.5V (falling) and is above 0.76 of $V_{OC}$, the chip operates in pass-through mode. The pass-through efficiency is high and on the order of 99.5% at a standard test condition temperature of 25° C. Typically this occurs when the PV cell string is strong and there is no shading or localized disturbance of the light arriving at the module. As the input voltage approaches the output voltage, the converter turns high side n-channel transistor continuously. The output voltage is equal to the input voltage minus the voltage drop across the n-channel transistor.

Optimizing (or Switching) mode of operation: When the PV cell string voltage ($V_P$-$V_M$) is in the range of 5V-10.5V (rising) and 4.5V-10.5V (falling) and is less than 0.76 of $V_{OC}$, the multi-modal MPPT IC chip operates in optimizing mode where the power delivered by the cell string is the maximum available and reduced due to shading or perhaps one or more weak PV cells.

Active bypass mode of operation: When the PV cell string voltage ($V_P$-$V_M$) is in the range of 4.5-5V (rising) and 4.75-4.25 (falling), the chip operates in active bypass mode and the high-side nLDMOS is OFF and the low side nLDMOS is ON 100% of the time.

Schottky Barrier Rectifier (SBR) bypass mode of operation: When the PV cell string voltage ($V_P$-$V_M$) is in the range of 0-4.5V (rising) and 4.75-4.25 (falling), and ($V_{SW}$-$V_M$) is less than 0.8 V, the multi-modal MPPT IC chip operates in SBR bypass mode where the Schottky diode is ON, and the high-side nLDMOS and the low side nLDMOS are both OFF.

Shutdown Mode: When the PV cell string voltage ($V_P$-$V_M$) is zero, and ($V_{SW}$-$V_M$) is greater than 0.7 V, there is no power and everything is off.

Figure 38:
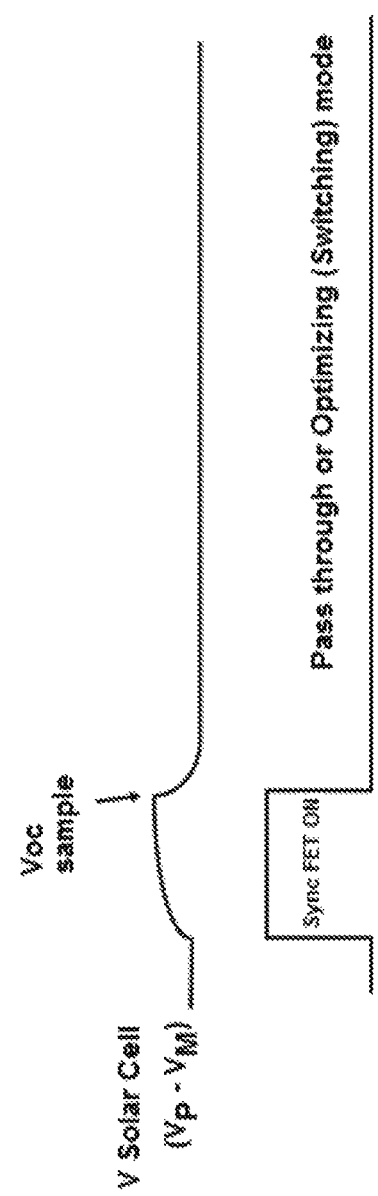

FIG. 38 shows the timing diagram of the sample and hold circuit. During operation the timing circuit has to sample the solar cell string open circuit voltage. It accompanies this by turning off the pass NFET (high side nFET) and turning on the Sync nFET (low side nFET). This does two things. First, it unloads the solar cell, and second it shorts the output so the panel current can keep flowing. While the Pass nFET is off, the circuit must wait for the $C_{IN}$ capacitor to charge up to $V_{OC}$. With a 4.7 µF capacitor and considerable PV cell string distributed capacitance and a 2.27 amp solar PV cell string this approximately takes approximately 250 µsec (250 micro-seconds). The circuit permits about 320 µsec (320 micro-seconds) which is long enough for any condition. Therefore, a very weak cell string (e.g., weakened due to localized shading) could have a 0.2 A capability and still meets the timing requirement. After the $V_{OC}$ is measured, the Sync FET is turned off and the Pass FET is turned on and normal operation is restored. These are shown in the timing diagrams of FIG. 38.

The included descriptions and figures depict specific implementations to teach those skilled in the art how to make and use the best mode. For the purpose of teaching inventive principles, some conventional aspects have been simplified or omitted. Those skilled in the art will appreciate variations from these implementations that fall within the scope of the disclosure. Those skilled in the art will also appreciate that the features described above can be combined in various ways to form multiple implementations. As a result, the disclosure is not limited to the specific implementations described above, but only by the claims and their equivalents. The claims constitute part of the original disclosure.

What is claimed is:

1. A solar photovoltaic (PV) module for distributed solar electric power generation, the module comprising:
    a plurality of strings of solar cells, each string comprising a plurality of solar cells electrically connected together, and further comprising a positive lead and a negative lead; and
    a plurality of multi-modal maximum-power-point tracking (MPPT) integrated circuits (ICs), each of said MPPT ICs having input terminals and output terminals, and having a pin structurally capable of enabling or disabling the MPPT IC function by the applied voltage on said pin being high or low, such that each string of solar cells is connected to the input terminals of a corresponding MPPT IC via the string's positive and negative leads;
    wherein each of the plurality of MPPT ICs is enhanced with an add-on electronic circuit for protection of the corresponding MPPT IC and testing of the module;
    wherein each add-on electronic circuit comprises a reverse-current-flow protection circuit coupled across the corresponding MPPT IC;
    wherein each reverse-current-flow protection circuit comprises an active bypass circuit, enabling flash current-voltage testing and electro-luminescence testing of the module by bypassing and protecting the corresponding MPPT IC during reverse current flow opposite a photo-generated electrical current flow;
    wherein each active bypass circuit comprises a bypass field effect transistor (FET) and a comparator, wherein said each comparator comprises electrical input leads that are connected to one of each of said input terminals and output terminals, and said comparator electrical input leads also connected to the source and drain of a corresponding bypass field-effect transistor (FET), with the combination of a comparator and a corresponding bypass field-effect transistor operating as reverse current flow detector and said reverse-current-flow protection circuit;
    wherein each add-on electronic circuit further comprises a Power-On-Reset (POR) circuit operating to prevent and delay each of said MPPT ICs from turning on and operating as a power optimizer by disabling a corresponding MPPT IC via its pin voltage, and each Power-On-Reset (POR) circuit operating to turn on a corresponding bypass field-effect transistor (FET) during flash current-voltage testing.

2. The module of claim 1, wherein the solar cells in each string comprise crystalline silicon solar cells partitioned into smaller sub-cells.

3. The module of claim 2, wherein an area of a sub-cell is one-half, one-third, or one-fourth of a full solar cell.

4. The module of claim 1, wherein the plurality of MPPT ICs are connected together according to an output interconnection pattern.

5. The module of claim 4, wherein the output interconnection pattern is an electrical series connection with the said output terminals of the plurality of MPPT ICs connected in electrical series.

6. The module of claim 4, wherein the output interconnection pattern is a hybrid connection with said output terminals of the plurality of MPPT ICs connected in a combination of electrical series and parallel.

7. The module of claim 1, wherein each reverse-current-flow protection circuit allows normal operation of a corresponding one of the MPPT ICs during PV power generation producing photo-generation electrical current flow.

8. The module of claim 1, wherein each FET provides a low-resistance reverse current flow path that bypasses the corresponding MPPT IC.

9. The module of claim 1, wherein each FET provides a high-resistance state as it remains off during normal photo-generation current flow, enabling normal operation of a corresponding MPPT IC.

10. The module of claim 1, wherein each FET is a p-channel FET.

11. The module of claim 1, wherein each comparator detects reverse current flow and switches a corresponding FET to its ON state to provide a low resistance path for reverse current flow, thereby bypassing and protecting a corresponding MPPT IC.

12. The module of claim 1, wherein each comparator is electrically powered by a string of solar cells coupled to the corresponding MPPT IC.

13. The module of claim 1, wherein the MPPT ICs are enhanced with the add-on electronic circuits by monolithically integrating an add-on electronic circuit with an MPPT IC into the same package, or hybridly integrating an add-on electronic circuit to a separately packaged MPPT IC.

14. The module of claim 1, wherein each POR circuit prevents and delays a corresponding MPPT IC from turning on or operating, by temporarily disabling the corresponding MPPT IC and turning on a corresponding bypass FET, providing low-resistance path around the corresponding MPPT IC for photo-generated current flow during flash current-voltage sweep testing.

15. The module of claim 1, wherein the flash current-voltage sweep testing comprises a voltage sweep from short-circuit condition to open circuit condition or vice versa across output electrical terminals of the module.

16. The module of claim 1, wherein each POR circuit detects a short-circuit or open circuit condition and turns on a corresponding bypass FET while disabling a corresponding MPPT IC for a specified period of time to perform the flash current-voltage sweep testing.

17. The module of claim 1, wherein each add-on electronic circuit provides protection against reverse-current-flow failure of a corresponding MPPT IC.

18. The module of claim 17, wherein each add-on electronic circuit enables electro-optical testing of the module.

19. The module of claim 18, wherein the electro-optical testing comprises electro-luminescence testing.

* * * * *